United States Patent
Zhang et al.

(10) Patent No.: US 12,514,079 B2
(45) Date of Patent: Dec. 30, 2025

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yiyang Zhang, Beijing (CN); Pengfei Yu, Beijing (CN); Tingyan Yang, Beijing (CN); Guangzhou Zhao, Beijing (CN); Huiyang Yu, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 525 days.

(21) Appl. No.: 18/016,685

(22) PCT Filed: Aug. 5, 2021

(86) PCT No.: PCT/CN2021/110884
§ 371 (c)(1),
(2) Date: Jan. 18, 2023

(87) PCT Pub. No.: WO2022/052695
PCT Pub. Date: Mar. 17, 2022

(65) Prior Publication Data
US 2023/0276668 A1  Aug. 31, 2023

(30) Foreign Application Priority Data
Sep. 10, 2020 (CN) .......... 202010948934.3

(51) Int. Cl.
*H10K 59/131* (2023.01)
*H10K 59/80* (2023.01)
*H10K 59/88* (2023.01)

(52) U.S. Cl.
CPC ....... *H10K 59/131* (2023.02); *H10K 59/8722* (2023.02); *H10K 59/873* (2023.02); *H10K 59/8731* (2023.02); *H10K 59/88* (2023.02)

(58) Field of Classification Search
CPC ............ H10K 59/131; H10K 59/8722; H10K 59/873; H10K 59/8731; H10K 59/88
See application file for complete search history.

(56) References Cited

U.S. PATENT DOCUMENTS 8,149,498 B2    4/2012 Hsieh et al.
2017/0033312 A1* 2/2017 Kim ............... H10K 59/873
(Continued)

FOREIGN PATENT DOCUMENTS

CN    106054465 A    10/2016
CN    106953024 A     7/2017
(Continued)

OTHER PUBLICATIONS

International Search Report and Written Opinion mailed on Oct. 14, 2021, in corresponding PCT/CN2021/110884, 17 pages.

*Primary Examiner* — Andres Munoz
(74) *Attorney, Agent, or Firm* — XSENSUS LLP

(57) ABSTRACT

Provided is a display substrate. The display substrate includes: a base substrate, provided with a display region; a plurality of pixel units, disposed in the display region; a barrier structure; surrounding the display region; a first organic film layer, disposed on one side of the base substrate; and at least one first power line, disposed on a side, proximal to the base substrate, of the first organic film layer, wherein one end of the first power line is disposed on a side, distal from the display region, of the barrier structure and (Continued)

configured to receive a first power signal, and the other end of the first power line is disposed on a side, proximal to the display region of the barrier structure and connected to the plurality of pixel units.

20 Claims, 21 Drawing Sheets

(56) References Cited

U.S. PATENT DOCUMENTS

| | | | | |
|---|---|---|---|---|
| 2017/0365814 | A1* | 12/2017 | Kim | H10K 59/8731 |
| 2018/0033831 | A1* | 2/2018 | An | H10K 59/87 |
| 2018/0145127 | A1* | 5/2018 | Shin | H10K 59/1315 |
| 2019/0288234 | A1* | 9/2019 | Kim | H10K 59/122 |
| 2019/0296099 | A1* | 9/2019 | Lee | H10K 59/131 |
| 2020/0006461 | A1* | 1/2020 | Cho | H10K 59/1315 |
| 2020/0168685 | A1* | 5/2020 | Bang | G06F 3/0412 |
| 2021/0181558 | A1 | 6/2021 | Nie | |
| 2021/0225994 | A1* | 7/2021 | Long | H10K 50/844 |
| 2021/0343976 | A1 | 11/2021 | Miao | |

FOREIGN PATENT DOCUMENTS

| | | |
|---|---|---|
| CN | 107437555 A | 12/2017 |
| CN | 109326740 A | 2/2019 |
| CN | 109633989 A | 4/2019 |
| CN | 109841756 A | 6/2019 |
| CN | 110097822 A | 8/2019 |
| CN | 110265565 A | 9/2019 |
| CN | 110277506 A | 9/2019 |
| CN | 110660812 A | 1/2020 |
| CN | 110690264 A | 1/2020 |
| KR | 2012-0072173 A | 7/2012 |

* cited by examiner

DISPLAY SUBSTRATE AND DISPLAY DEVICE

CROSS-REFERENCE TO RELATED APPLICATION

This application is a U.S. national stage of international application No. PCT/CN2021/110884, filed on Aug. 5, 2021, which is based on and claims the priority to Chinese Patent Application No. 202010948934.3, filed on Sep. 10, 2020 and entitled "DISPLAY SUBSTRATE AND DISPLAY DEVICE," the disclosures of which are incorporated herein by references in their entireties.

TECHNICAL FIELD

The present disclosure relates to the field of display technologies, and more particularly relates to a display substrate and a display device.

BACKGROUND OF THE INVENTION

A display substrate typically includes a plurality of pixel units arranged in an array in a display region of a base substrate, and a power trace (commonly referred to as a VDD trace) for supplying a positive power signal to each pixel unit.

SUMMARY OF THE INVENTION

The present disclosure provides a display substrate and a display device. The technical solutions are as follows:

According to some embodiments of the present disclosure, a display substrate is provided. The display substrate includes:
- a base substrate, provided with a display region;
- a plurality of pixel units, disposed in the display region;
- a barrier structure, surrounding the display region;
- a first organic film layer, disposed on one side of the base substrate, wherein a gap is defined between an orthographic projection of the first organic film layer on the base substrate and an orthographic projection of the barrier structure on the base substrate; and
- at least one first power line disposed on a side, proximal to the base substrate, of the first organic film layer, wherein one end of the first power line is disposed on a side, distal from the display region, of the barrier structure and configured to receive a first power signal, and the other end of the first power line is disposed on a side, proximal to the display region, of the barrier structure and connected to the plurality of pixel units, wherein a length of a side edge of a segment, covered by the barrier structure, of the first power line is greater than a length of a side edge of a segment, covered by a virtual barrier structure with an equal width, of the first power line, and an extension direction of the virtual barrier structure is parallel to an extension direction of the barrier structure.

In some embodiments, a plurality of first bump structures are disposed on a side edge of the first power line, In some embodiments, the length of the side edge of the segment, covered by the barrier structure, of the first power line is greater than a length of one of the first bump structures.

In some embodiments, the length of the side edge of the segment, covered by the barrier structure, of the first power line is greater than a length of the first bump structure covered by the virtual barrier structure.

In some embodiments, an orthographic projection of the first bump structure on the base substrate is not overlapped with the orthographic projection of the first organic film layer on the base substrate, and is not overlapped with the orthographic projection of the barrier structure on the base substrate.

In some embodiments, the length of the side edge of the segment, covered by the barrier structure, of the first power line is greater than the length of the side edge of the segment, covered by the virtual barrier structure, of the first power line at any position.

In some embodiments, an orthographic projection of a side edge of a portion, covered by the barrier structure, of the first power line on the base substrate is a broken line, and each two adjacent segments of the broken line are perpendicular to each other.

In some embodiments, in the segments, covered by the barrier structure, of the first power line, a width of a portion proximal to the display region is greater than a width of a portion distal from the display region.

In some embodiments, a length of a side edge of a segment, covered by the first organic film layer, of the first power line is greater than a length of a side edge of a segment, covered by a virtual first organic film layer with an equal width, of the first power line; and an extension direction of the virtual first organic film layer is parallel to an extension direction of the first organic film layer.

In some embodiments, in the segments, covered by the first organic film layer, of the first power line, a width of a segment in a region surrounded by the barrier structure is greater than a width of a segment outside the region surrounded by the barrier structure.

In some embodiments, a difference between the length of the side edge of the segment, covered by the barrier structure, of the first power line and the length of the side edge of the segment, covered by the virtual barrier structure, of the first power line is greater than 400 µm.

In some embodiments, the length of the side edge of the segment, covered by the barrier structure, of the first power line is greater than 5 times a width of the barrier structure.

In some embodiments, the barrier structure includes a first barrier dam and a second barrier dam;
wherein the first barrier dam is distal from the display region relative to the second barrier dam, and a thickness of the first barrier dam is greater than a thickness of the second barrier dam.

In some embodiments, a width of the first barrier dam is greater than or equal to a first width threshold, and a width of the second barrier dam is greater than or equal to a second width threshold.

In some embodiments, a first distance between the first barrier dam and the second barrier dam in an extension direction of the first power line is greater than or equal to a first distance threshold.

In some embodiments, the first width threshold, the second width threshold and the first distance threshold are all 40 µm.

In some embodiments, the first power line includes a first segment and a second segment;
wherein the first segment is distal from the display region relative to the second segment and is covered by the first barrier dam, the second segment is covered by the second barrier dam, a length of a side edge of the first segment is greater than the length of the side edge of the segment, covered by the virtual barrier structure, of the first power line, and a length of a side edge of the second segment is greater than the length of the side edge of the segment, covered by the virtual barrier structure, of the first power line.

In some embodiments, the length of the side edge of the first segment is 1 to 5 times the length of the side edge of the second segment.

In some embodiments, the first barrier dam includes: a first pattern of the first organic film layer, a second pattern of a second organic film layer, and a third pattern of a third organic film layer that are successively laminated along a side distal from the base substrate.

In some embodiments, the second barrier dam includes: a fourth pattern of the second organic film layer and a fifth pattern of the third organic film layer that are successively laminated along the side distal from the base substrate.

In some embodiments, the display substrate further includes at least one strip-shaped extending structure; wherein the strip-shaped extending structure is disposed on a side, proximal to the display region, of the barrier structure, and connected to a side edge of the other end of the one first power line, and an extension direction of the extending structure is perpendicular to the extension direction of the first power line.

In some embodiments, the display substrate includes two first power lines; wherein the two first power lines are arranged axially symmetrically about an axis of the base substrate.

In some embodiments, the other ends of the two first power lines are integrally formed.

In some embodiments, the display substrate further includes: a cathode layer and a second power line; wherein
the cathode layer is disposed on a side, distal from the base substrate, of the first organic film layer; and
the second power line is disposed in a same layer as the first power lines, and the second power line includes a first portion and a second portion; wherein the first portion is disposed on the side, distal from the display region, of the barrier structure, and configured to receive a second power signal, the second portion surrounds the display region, an orthographic projection of the second portion on the base substrate is overlapped with the orthographic projection of the barrier structure on the base substrate; and the second portion is connected to the cathode layer.

In some embodiments, the display substrate further includes a plurality of second bump structures disposed on a side edge of a connecting portion.

In some embodiments, an orthographic projection of the second bump structure on the base substrate is not overlapped with the orthographic projection of the first organic film layer on the base substrate; and the orthographic projection of the second bump structures on the base substrate is not overlapped with the orthographic projection of the barrier structure on the base substrate.

In some embodiments, the second portion of the second power line includes: a connecting portion and a surrounding portion; wherein the connecting portion is connected to the first portion and the surrounding portion, and the surrounding portion surrounds the display region; and
a length of a side edge of a portion, covered by the barrier structure, of the connecting portion is greater than a length of a side edge of a portion, covered by the virtual barrier structure, of the connecting portion.

In some embodiments, an orthographic projection of the side edge of the portion, covered by the barrier structure, of the connecting portion on the base substrate is the broken line, and each two adjacent segments of the broken line are perpendicular to each other.

In some embodiments, an orthographic projection of the side edge of the portion, covered by the barrier structure, of the connecting portion on the base substrate is a straight line, the straight line being parallel to the extension direction of the first power line; a second distance between the first power line and the connecting portion is greater than or equal to a second distance threshold; a third distance between the first power line and the connecting portion is greater than or equal to a third distance threshold; and a fourth distance between the first power line and the connecting portion is greater than or equal to a fourth distance threshold;
wherein the second distance is a maximum distance between a segment, covered by a first barrier dam of the barrier structure, of the first power line and the connecting portion in a direction perpendicular to the extension direction of the first power line; the third distance is a maximum distance between a segment, disposed between the first barrier dam and the second barrier dam of the barrier structure, of the first power line and the connecting portion in the direction perpendicular to the extension direction of the first power line; the fourth distance is a maximum distance between a segment, covered by the second barrier dam, of the first power line and the connecting portion in the direction perpendicular to the extension direction of the first power line; the second distance threshold is greater than the third distance threshold; and the third distance threshold is greater than the fourth distance threshold.

In some embodiments, a fifth distance between the first power line and the connecting portion is greater than or equal to a fifth distance threshold; a sixth distance between the first power line and the connecting portion is greater than or equal to a sixth distance threshold.
wherein the fifth distance is a maximum distance between the segment, covered by the first organic film layer and disposed outside a region surrounded by the barrier structure, of the first power line and the connecting portion in the direction perpendicular to the extension direction of the first power line; the sixth distance is a maximum distance between the segment, covered by the first organic film layer and disposed in the region surrounded by the barrier structure, of the first power line and the connecting portion in the direction perpendicular to the extension direction of the first power line; the fifth distance threshold is greater than the second distance threshold; and the sixth distance threshold is less than the fourth distance threshold.

In some embodiments, the second distance threshold is 3323 μm, the third distance threshold is 2723 μm, the fourth distance threshold is 2123 μm, the fifth distance threshold is 3795 μm, and the sixth distance threshold is 1523 μm.

In some embodiments, the display substrate further includes at least one strip-shaped extending structure; wherein the strip-shaped extending structure is disposed on the side, proximal to the display region, of the barrier structure, and connected to the side edge of the other end of the one first power line; the extension direction of the extending structure is perpendicular to the extension direction of the first power line; and
the connecting portion is distal from the display region relative to the extending structure.

In some embodiments, the orthographic projection of the side edge of the portion, covered by the barrier structure, of the first power line on the base substrate is the broken line, and an orthographic projection of the side edge of the segment, covered by the first organic film layer, of the first power line on the base substrate is the broken line;
  a seventh distance between a first step line and a second step line of the first power line in the extension direction of the first power line is greater than or equal to a seventh distance threshold;
  an eighth distance between the second step line and a third step line of the first power line in the extension direction of the first power line is greater than or equal to an eighth distance threshold;
  a ninth distance between the third step line and a fourth step line of the first power line in the extension direction of the first power line is greater than or equal to a ninth distance threshold;
  a tenth distance between the fourth step line and the extending structure in the extension direction of the first power line is greater than or equal to a tenth distance threshold; and
  the first step line is covered by the portion of the first organic film layer disposed outside the region surrounded by the barrier structure, the second step line is covered by the first barrier dam of the barrier structure, the third step line is covered by the second barrier dam of the barrier structure, the fourth step line is covered by the portion of the first organic film layer disposed in the region surrounded by the barrier structure, and the first step line, the second step line, the third step line, and the fourth step line are all perpendicular to the extension direction of the first power line.

In some embodiments, the seventh distance threshold is 140 μm, the eighth distance threshold is 80 μm, the ninth distance threshold is 110 μm, and the tenth distance threshold is 275 μm.

In some embodiments, an eleventh distance between the extending structure and the connecting portion in a direction perpendicular to an extension direction of the extending structure is greater than an eleventh distance threshold.

In some embodiments, the eleventh distance threshold is 80 μm.

In some embodiments, the first organic film layer covers the first portion of the second power line, a boundary, proximal to the display region of the second portion of the second power line, and a boundary, distal from the display region of the second portion.

In some embodiments, the second power line includes the two first portions,
  wherein one of the first portions is connected to one end of the second portion, the other of the first portions is connected to the other end of the second portion, and the two first portions are arranged axially symmetrically about the axis of the base substrate.

In some embodiments, one end of the first power line is disposed between the two first portions.

According to some embodiments of the present disclosure, a display device is provided. The display device includes a power drive circuit and the display substrate according to the above embodiments;
  wherein the power drive circuit is connected to at least one first power line in the display substrate and configured to supply the first power signal to the first power line.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description illustrate merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

In some way, a base substrate includes a packaging region surrounding a display region. One end of a VDD trace is disposed outside the packaging region, and configured to be connected to a drive circuit; and the other end of the VDD trace is connected to pixel units in the packaging region of the base substrate, such that a positive power signal is supplied from the drive circuit to the pixel units. In order to avoid corrosion of the VDD trace caused by exposure of a side edge of the VDD trace, the VDD trace needs to be covered by an organic layer.

However, since the organic layer is typically made of a hydrophilic material and is in contact with the portion, within the packaging region, of the VDD trace, and meanwhile the organic layer is also disposed in the display region, in the case that the other end, outside the packaging region, of the VDD trace carries moisture or oxygen into the packaging region, the moisture enters the display region via the organic layer, thereby affecting a display effect of the display substrate.

Figure 1:
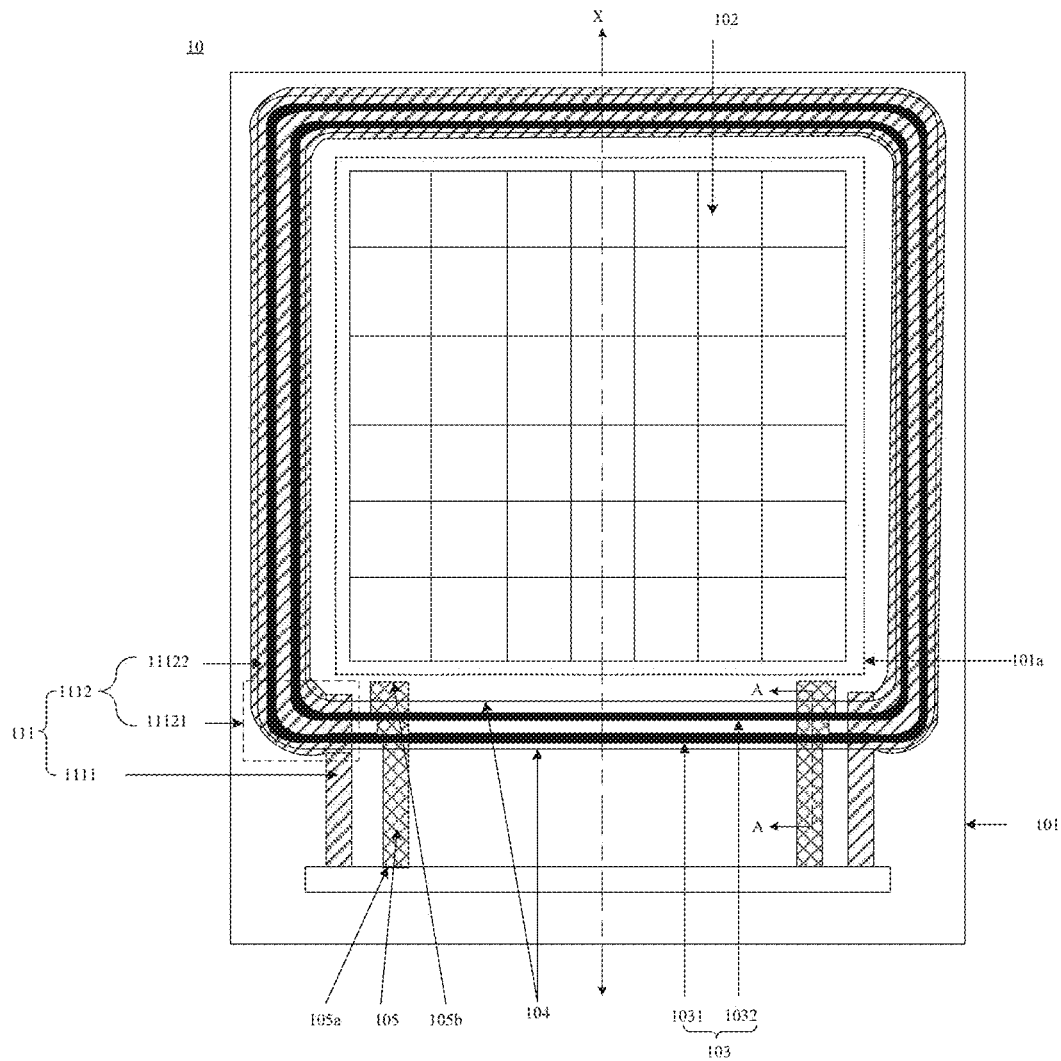
FIG. 1 is a schematic structural diagram of a display substrate according to some embodiments of the present disclosure.
Figure 2:
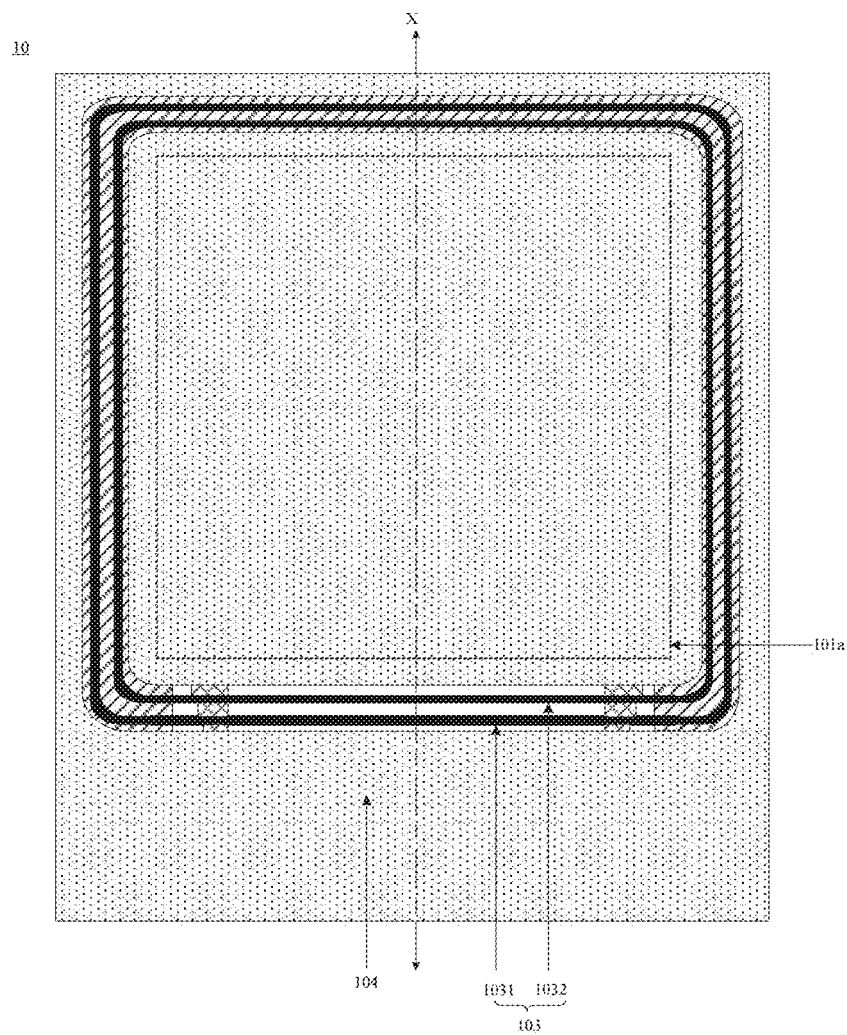
FIG. 2 is a schematic structural diagram of another display substrate according to some embodiments of the present disclosure.
Figure 3:
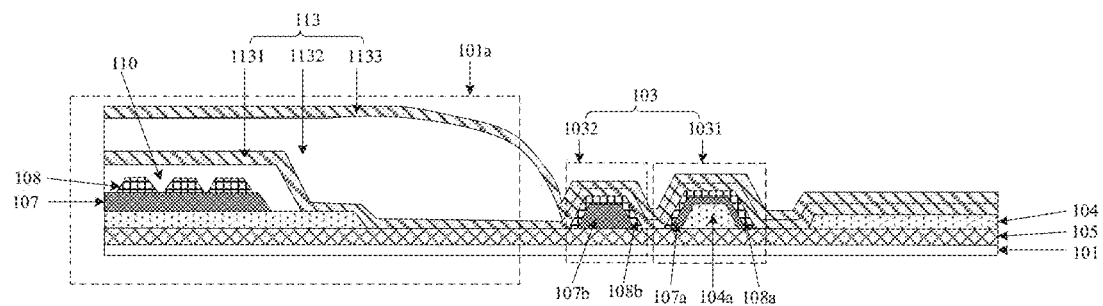
FIG. 3 is a cross-sectional view of the display substrate in FIG. 1 in an A-A direction.

FIG. 1 is a schematic structural diagram of a display substrate according to some embodiments of the present disclosure. FIG. 2 is a schematic structural diagram of another display substrate according to some embodiments of the present disclosure. FIG. 3 is a cross-sectional view of the display substrate in FIG. 1 in an A-A direction. Referring to FIGS. 1 to 3, the display substrate 10 includes a base substrate 101, a plurality of pixel units 102, a barrier structure 103, a first organic film layer 104, and at least one first power line 105. The base substrate 101 is provided with a display region 101a. The plurality of pixel units 102 are disposed in the display region 101a. The barrier structure 103 surrounds the display region 101a. That is, referring to FIGS. 1 and 2, the barrier structure 103 surrounds the plurality of pixel units 102.

For clear illustration of the first power line 105, FIG. 1 only illustrates a boundary of the first organic film layer 104, but does not illustrate the first organic film layer 104 using a hatched pattern. FIG. 2 illustrates the first organic film layer 104 using a hatched pattern, so as to illustrate positional relationships between the first organic film layer 104 and the barrier structure 103, and between the first organic film layer 104 and the at least one first power line 105. Referring to FIGS. 1 to 3, the first organic film layer 104 is disposed on one side of the base substrate 101, and a gap is defined between an orthographic projection of the first organic film layer 104 on the base substrate 101 and an orthographic projection of the barrier structure 103 on the base substrate 101. The at least one first power line 105 is disposed on a side, proximal to the base substrate 101, of the first organic film layer 104. One end 105a of the first power line 105 is disposed on a side, distal from the display region 101a, of the barrier structure 103, and configured to receive a power signal. The other end 105b of the first power line 105 is disposed on a side, proximal to the display region 101a, of the barrier structure 103, and is connected to the plurality of pixel units 102.

Exemplarily, FIG. 1 illustrates two first power lines 105, wherein one end 105a of the first power line 105 is connected to a power drive circuit, and configured to receive a first power signal supplied by the power drive circuit. The display substrate 10 further includes more first power lines 105, which is not limited by the embodiments of the present disclosure.

Since the organic material from which the first organic film layer 104 is made is generally a hydrophilic material, by defining the gap defined between the orthographic projection of the first organic film layer 104 on the base substrate 101 and the orthographic projection of the barrier structure 103 on the base substrate 101, the portion, distal from the display region 101a, of the first organic film layer 104 disposed in the barrier structure 103, is not in contact with the portion, proximal to the display region 101a, of the first organic film layer 104 disposed in the barrier structure 103. In this way, the introduction of moisture or oxygen, by the ends 105a of the first power lines 105, to the pixel units 102 via the first organic film layer 104 is mitigated, such that yield of the display substrate 10 is ensured and the display device has a better display effect.

Figure 4:
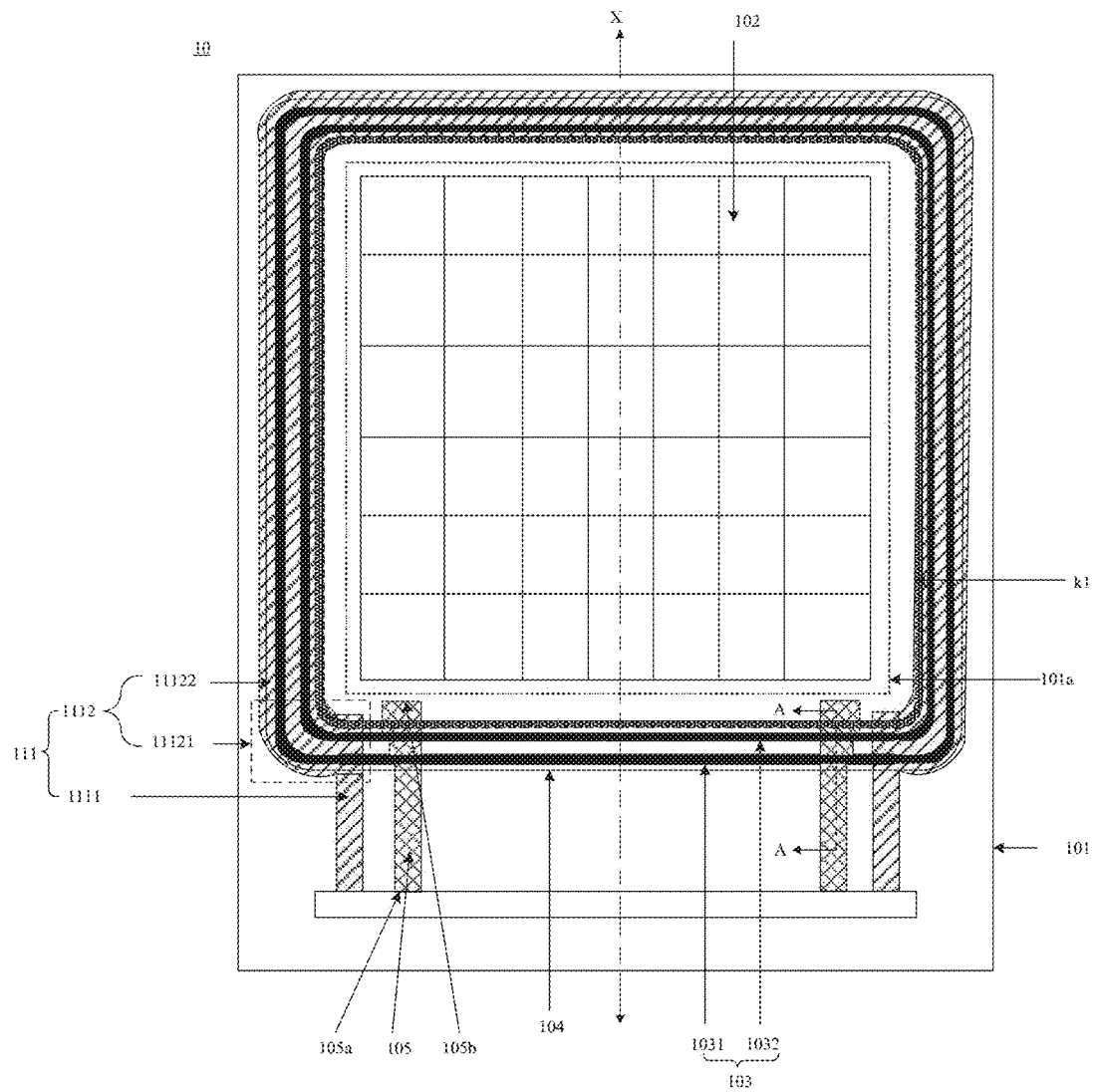
FIG. 4 is a schematic structural diagram of still another display substrate according to some embodiments of the present disclosure.

In addition, in some embodiments of the present disclosure, lengths of side edges of segments, covered by the barrier structure 103, of the first power lines 105 are greater than lengths of side edges of segments, covered by a virtual barrier structure with the equal width, of the first power lines 105. The lengths of the side edges of the segments, covered by the barrier structure 103, of the first power lines 105 refer to lengths of orthographic projections of the side edges, covered by the barrier structure 103, of the segments of the first power lines 105 on the base substrate 101. Referring to FIG. 4, an extension direction of a virtual barrier structure k1 is parallel to an extension of a barrier structure 103.

Figure 5:
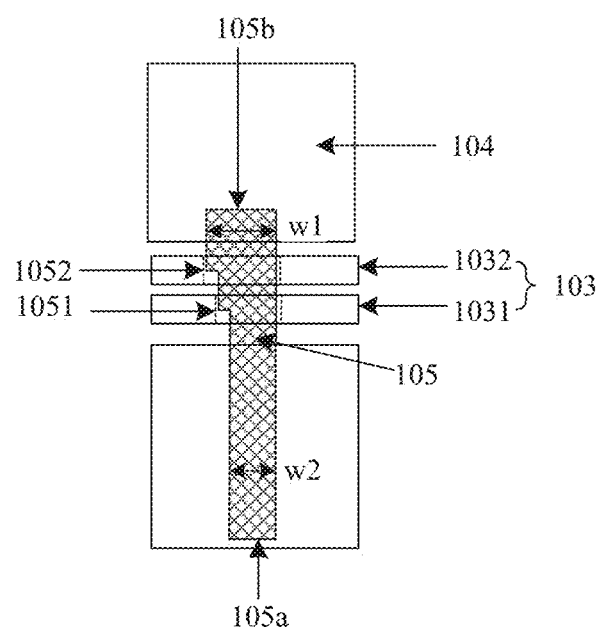
FIG. 5 is a partial schematic structural diagram of the display substrate in FIG. 1.

Exemplarily, referring to FIG. 5, an orthographic projection of a side edge of a segment, covered by the barrier structure 103, of the first power line 105 on the base substrate 101 is a broken line. Since the length of the side edge of the segment, covered by the barrier structure 103, of the first power line 105 is greater (for example, greater than a length of the side edge of the segment, covered by the virtual barrier structure, of the first power line 105), such that a path along which moisture or oxygen enters the pixel units via the first power line 105 is lengthened, thereby preventing moisture or oxygen from entering the plurality of pixel units 102.

In addition, since a gap is defined between the orthographic projection of the first organic film layer 104 on the base substrate 101 and the orthographic projection of the barrier structure 103 on the base substrate 101, a portion of the first power line 105 is not covered by the first organic film layer 104, that is, the portion of the first power line 105 is exposed. As a result, an etching solution reacts with the exposed portion of the first power line 105 in the process of forming an anode layer by a subsequent etching process, resulting in flaws at the boundary of the first power line 105. For example, a dark spot is formed at the boundary of the first power line 105, and the growing dark spot (GDS) causes the display device to fail, and thus affect the display effect of the display device.

In some embodiments of the present disclosure, since a portion, with a longer side edge, of the segment of the first power line 105 is covered by the barrier structure 103, a longer boundary of the first power line 105 is prevented from corrosion caused by a longer exposed segment of the first power line 105 on the premise of lengthening the path along which moisture or oxygen enters the pixel units via the first power line 105, such that formation of a large number of dark sports at the boundary of the first power line 105 is further avoided. That is, aggravation of the GDS defects is avoided, and the display device has a better display effect.

In summary, the embodiments of the present disclosure provide a display substrate. The length of the side edge of the segment, covered by the barrier structure, of the first power line in the display substrate is greater, such that the path along which moisture or oxygen enters via the first power line is lengthened, and thus moisture or oxygen is prevented from entering the pixel units. In addition, since the segment, with the longer side edge, of the first power line is covered by the barrier structure, the first power line is prevented from corrosion due to the longer exposed segment of the first power line, and quality of the first power line is ensured. Thus, the yield of the display substrate is ensured, and the display effect of the display device is improved.

In addition, the display substrate according to the embodiments of the present disclosure is not provided with an additional film layer, such that an additional mask and an additional manufacturing process are not needed during manufacturing, and thus a higher efficiency is achieved.

Figure 6:
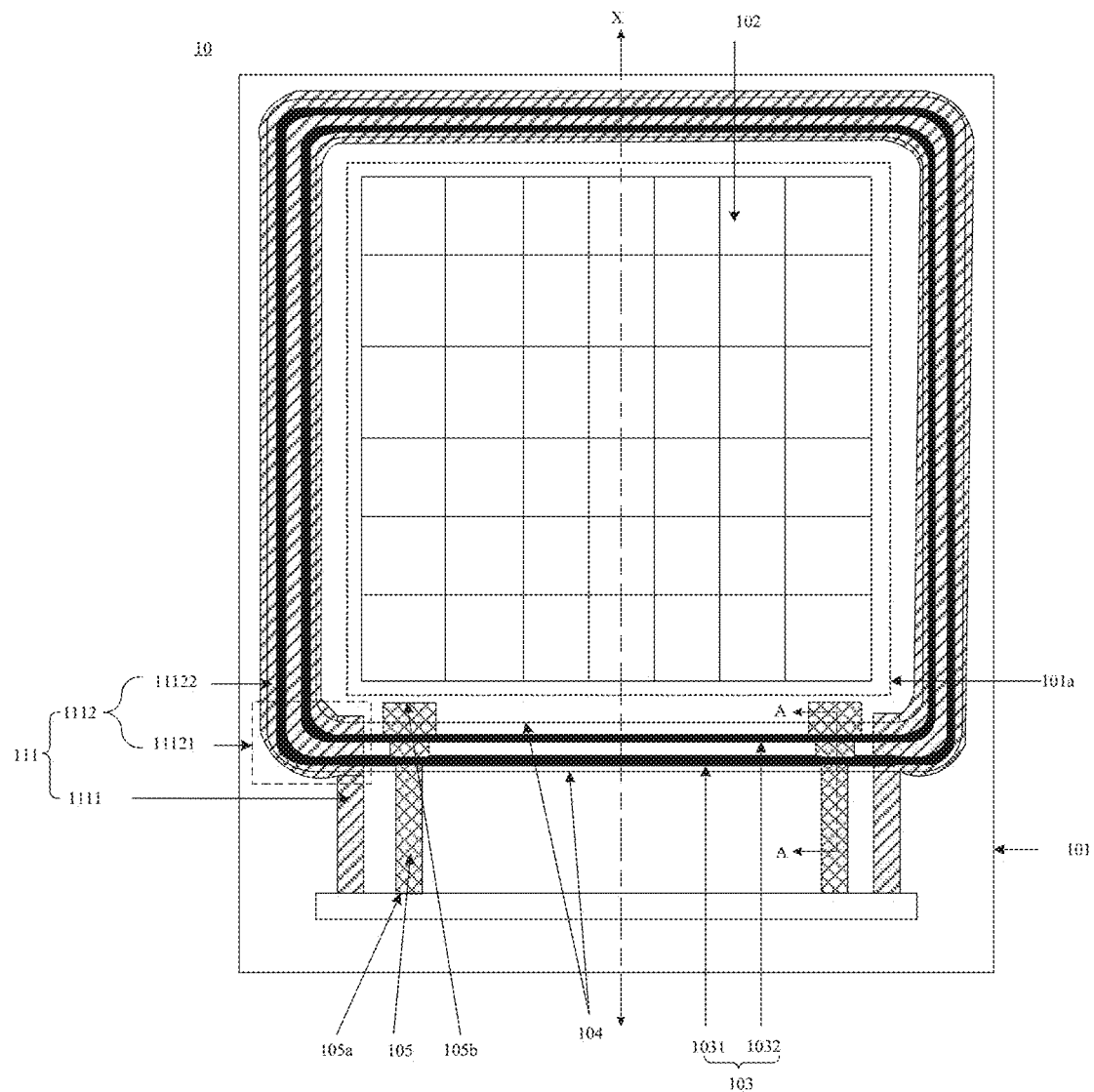
FIG. 6 is a schematic structural diagram of yet still another display substrate according to some embodiments of the present disclosure.

Referring to FIG. 1, the orthographic projection of the side edge of the segment, covered by the barrier structure 103, of the first power line 105 on the base substrate 101 is a broken line or a curve. Alternatively, referring to FIG. 6, orthographic projections of both side edges of the segment, covered by the barrier structure 103, of the first power line 105 on the base substrate 101 are broken lines or curves.

In some embodiments, a difference between the length of the side edge of the segment, covered by the barrier structure 103, of the first power line 105 and the length of the side edge of the segment, covered by the virtual barrier structure, of the first power line 105 is greater than 400 μm. In this way, the path along which moisture enters the pixel units is lengthened and the yield of the display substrate is ensured. In addition, the length of the side edge of the segment, covered by the barrier structure 103, of the first power line 105 is greater than 5 times the width of the barrier structure 103.

In some embodiments of the present disclosure, one end 105a of the first power line 105 is disposed outside the region surrounded by the barrier structure 103, and the other end of the first power line 105 is disposed in the region surrounded by the barrier structure 103. That is, the first power line 105 passes through the barrier structure 103 to enter the region surrounded by the barrier structure 103. The portion of the barrier structure 103 for the power line to pass through is referred to as a line inlet (port).

In some embodiments of the present disclosure, the other ends 105b of the plurality of first power lines 105 are connected to transistors in the pixel units 102 in the display substrate 10. For example, the other ends 105b of the plurality of first power lines 105 are connected to source electrodes or drain electrodes of the transistors in the pixel units 102. The first power lines 105 are configured to supply the first power signal (the first power signal is a positive power signal) to the transistors in the pixel units 102, and thus the first power lines 105 are also referred to as VDD power lines or VDD traces.

Figure 7:
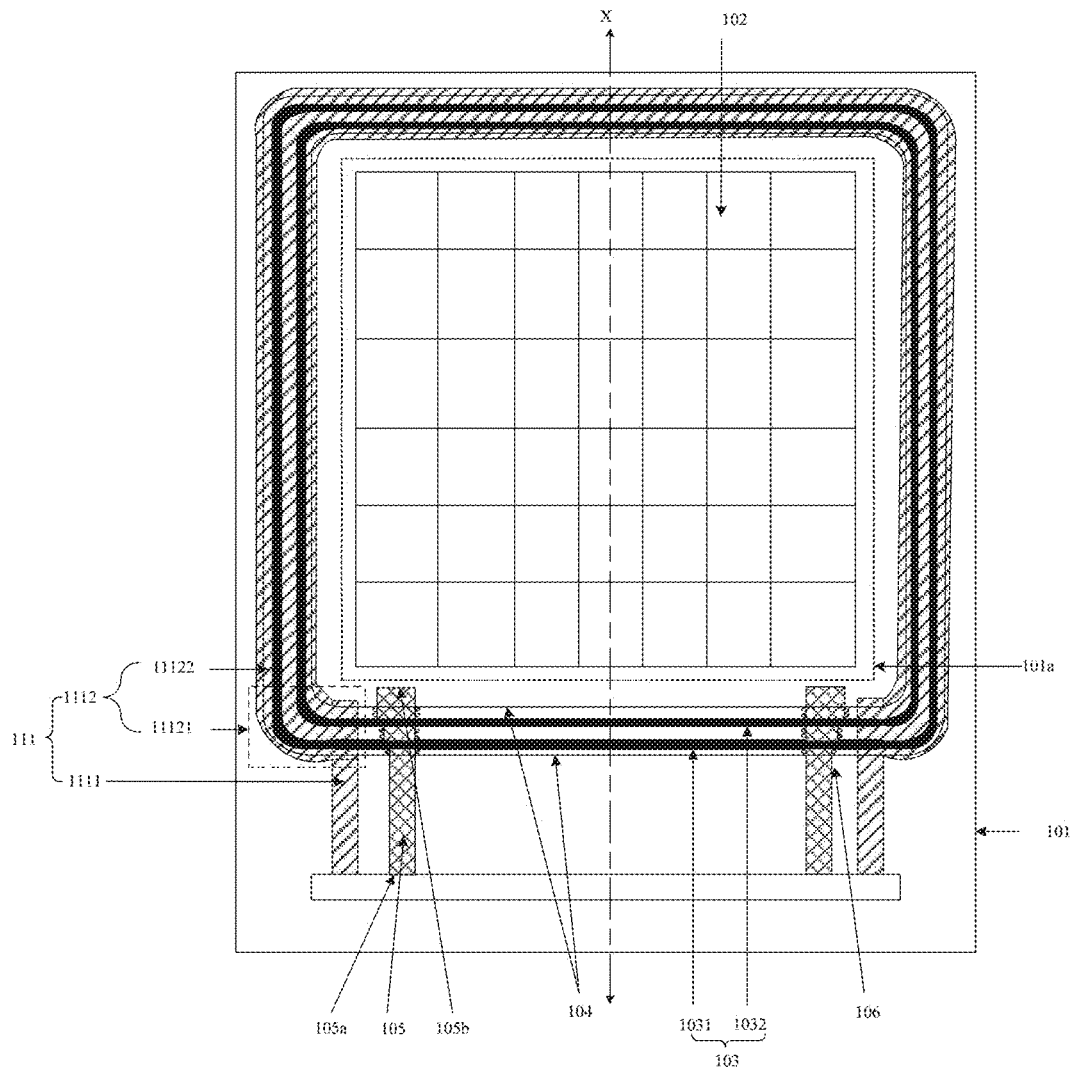
FIG. 7 is a schematic structural diagram of yet still another display substrate according to some embodiments of the present disclosure.

FIG. 7 is a schematic structural diagram of yet still another display substrate according to some embodiments of the present disclosure. Referring to FIG. 7, the display substrate further includes a plurality of bump structures 106 disposed on side edges of the first power lines 105.

Since the side edges of the segments, covered by the barrier structure 103, of the first power lines 105 are broken lines or curves, and the plurality of bump structures 106 are arranged on the side edges of the first power lines 105, the path along which moisture or oxygen enters the pixel units via the first power lines 105 is further lengthened to prevent moisture or oxygen from entering the plurality of pixel units 102 via the first power lines 105. The plurality of bump structures 106 and the first power lines 105 are prepared using the same material by one patterning process, and the plurality of first bump structures 106 are integrated with the first power lines 105.

Figure 8:
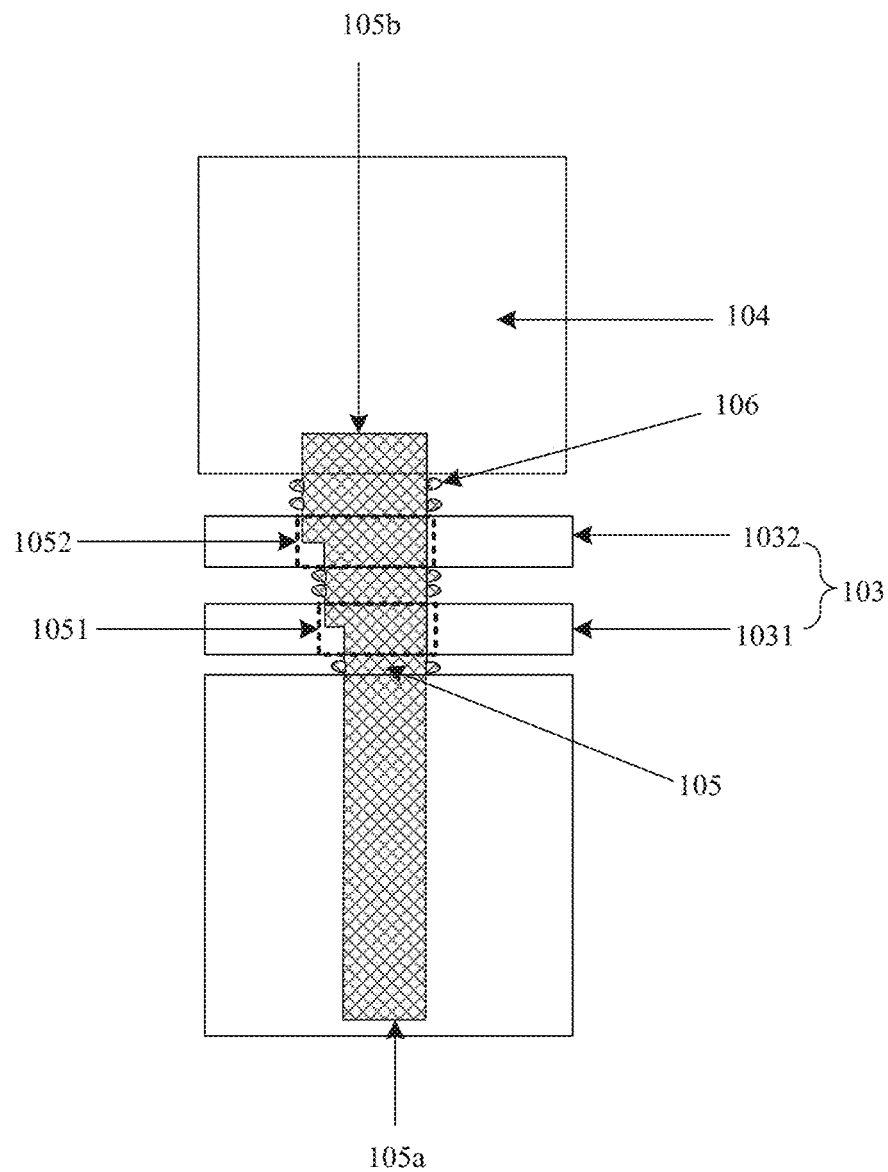
FIG. 8 is a partial schematic structural diagram of the display substrate in FIG. 7.

FIG. 8 is a partial schematic structural diagram of the display substrate illustrated in FIG. 7. Referring to FIG. 8, orthographic projections of the first bump structures 106 on the base substrate 101 are not overlapped with the orthographic projection of a first organic film layer 104 on the base substrate 101; and the orthographic projections of the first bump structures 106 on the base substrate 101 are not overlapped with the orthographic projection of the barrier structure 103 on the base substrate 101. That is, the first bump structures 106 are arranged on the side edges of the portions, not covered by the first organic film layer 104 and the barrier structure 103, of the first power lines 105, and thus the risk of corrosion of the portions, not covered by the first organic film layer 104 and the barrier structure 103, of the first power lines 105 is reduced to ensure the quality of the first power lines 105.

Figure 9:
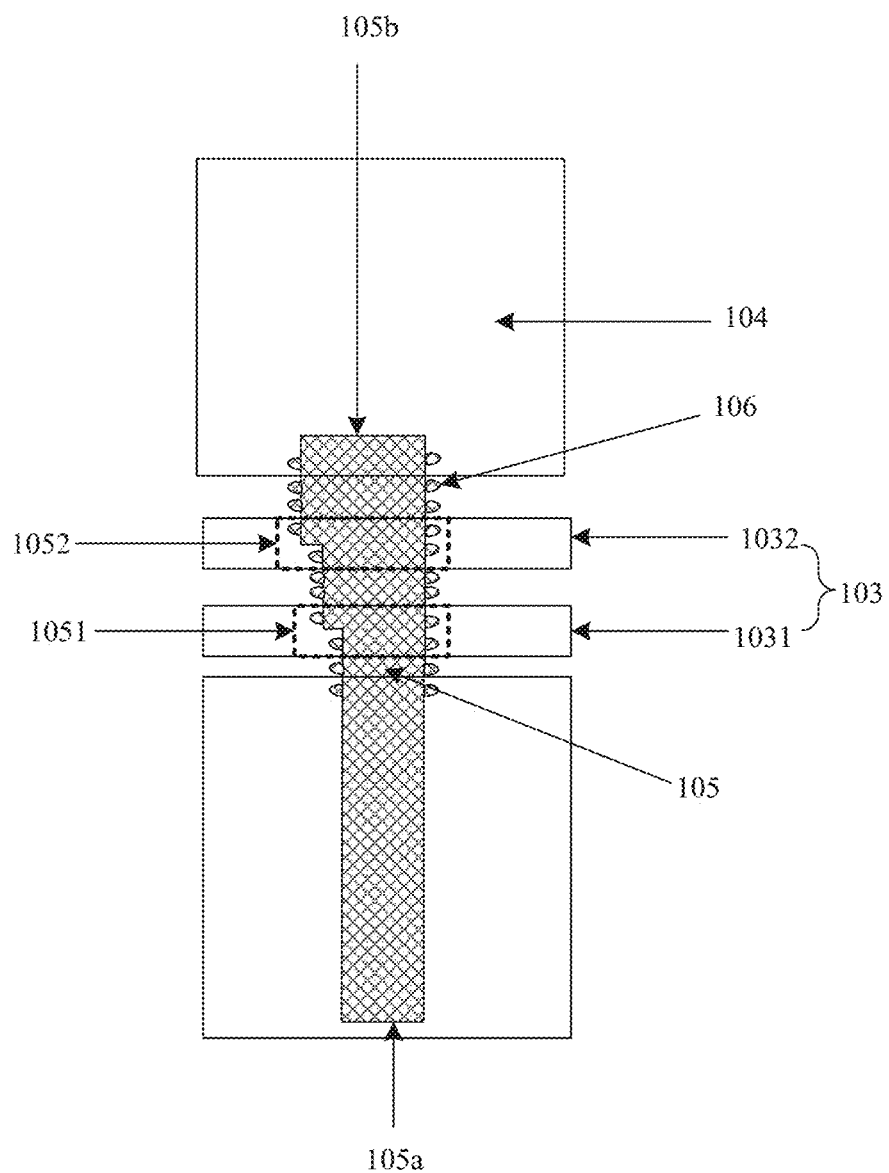
FIG. 9 is a partial schematic structural diagram of a display substrate according to some embodiments of the present disclosure.

Referring to FIG. 9, the orthographic projections of the first bump structures 106 on the base substrate 101 are also overlapped with the orthographic projections of the barrier structure 103 and the first organic film layer 104 on the base substrate 101. That is, the first bump structures 106 are arranged on side edges of the portions, covered by the first organic film layer 104, of the first power lines 105, or side edges of the portions, covered by the barrier structure 103, of the first power lines 105, in addition to the side edges of the portions, not covered by the first organic film layer 104 and the barrier structure 103, of the first power lines 105, such that the path along which moisture enters the pixel units is further lengthened to ensure the yield of the display substrate 10.

Referring to FIG. 5, an orthographic projection of one side edge of a portion, covered by the barrier structure 103, of the first power line 105 on the base substrate 101 is a broken line, and each two adjacent segments of the broken line are perpendicular to each other. That is, the side edges of the first power lines 105 are step-shaped.

In some embodiments, referring to FIGS. 1 and 5, in the segments, covered by the barrier structure 103, of the first power lines 105, widths w1 of the portions proximal to the display region 101a are greater than widths w2 of the portions distal from the display region 101a. That is, the widths w1 of the portions, proximal to the display region 101a. of the first power lines 105 are greater, and the widths w2 of the portions, distal from the display region 101a, of the first power lines 105 are less, such that areas of the regions of the first power lines 105 outside the barrier structure 103 are reduced, and the screen ratio of the display device is increased.

In the segments, covered by the barrier structure 103, of the first power lines 105, the widths of the portions proximal to the display region 101a are also less than the widths of the portions distal from the display region 101a, which is not limited by the embodiments of the present disclosure.

Figure 10:
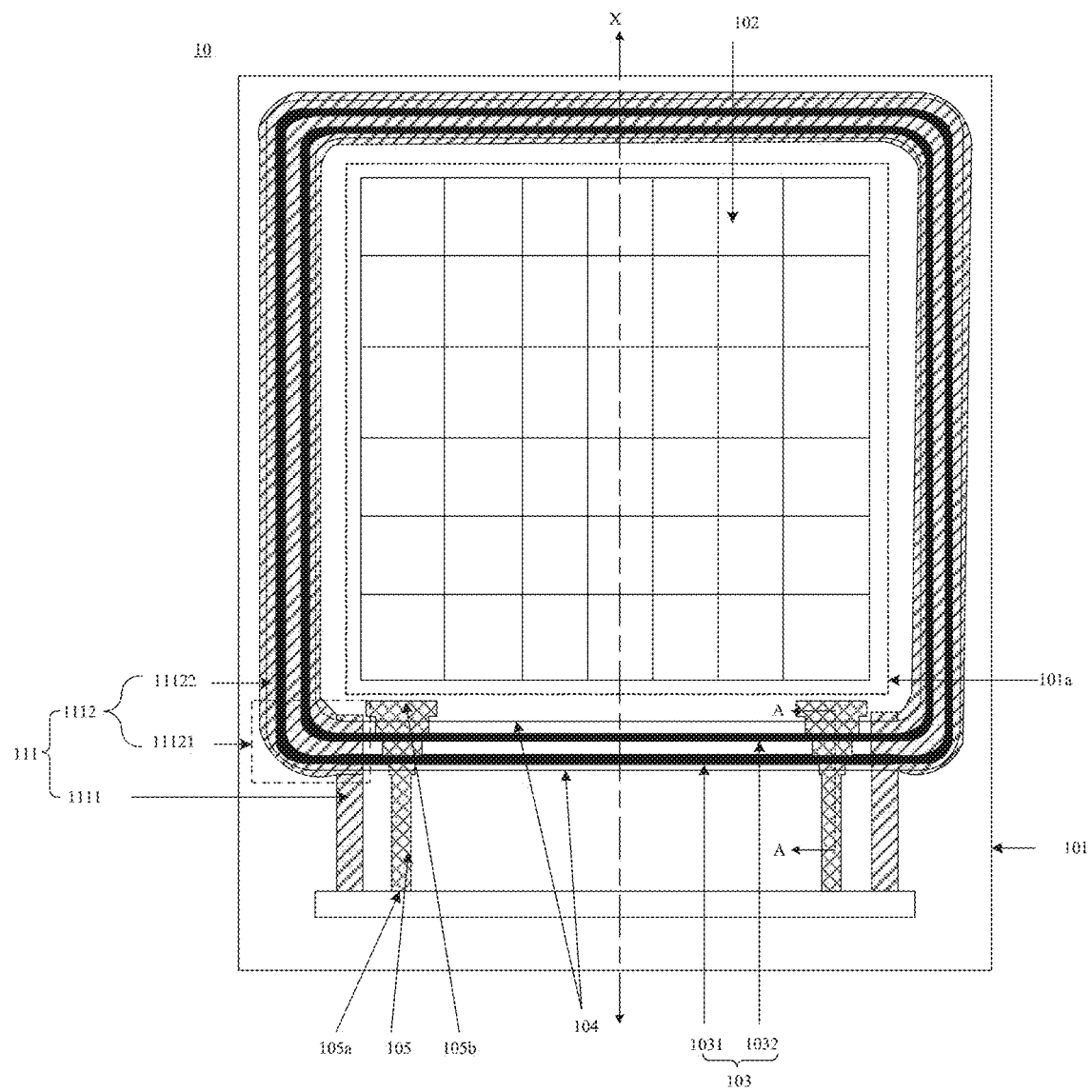
FIG. 10 is a schematic structural diagram of yet another display substrate according to some embodiments of the present disclosure.
Figure 11:
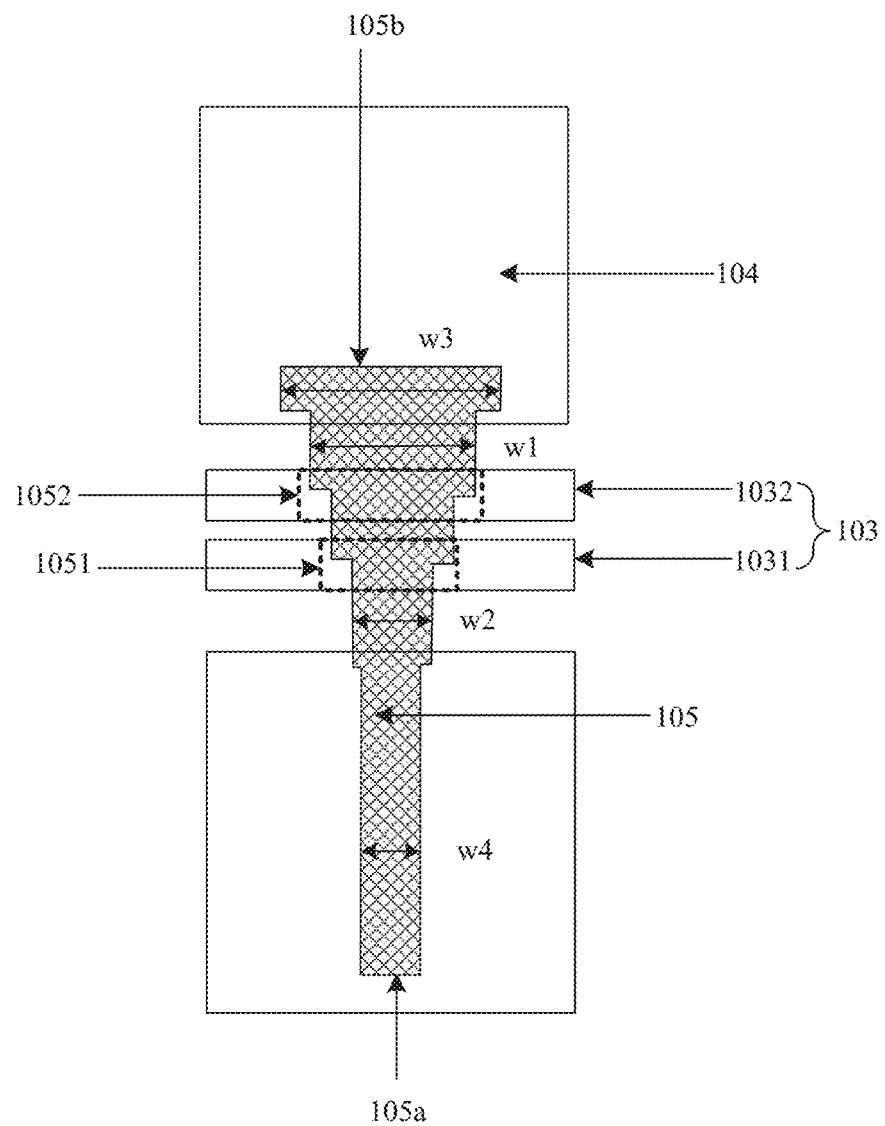
FIG. 11 is a partial schematic structural diagram of the display substrate in FIG. 10.

FIG. 10 is a schematic structural diagram of yet still another display substrate according to some embodiments of the present disclosure. FIG. 11 is a partial schematic structural diagram of the display substrate illustrated in FIG. 10.

Referring to FIGS. 10 and 11, lengths of side edges of segments, covered by a first organic film layer 104, of first power lines 105 are greater than lengths of side edges of the segments, covered by a virtual first organic film layer with the equal width, of the first power lines 105.

The lengths of the side edges of the segments, covered by the first organic film layer 104, of the first power lines 105 refers to the lengths of orthographic projections of the side edges of the segments, covered by the virtual first organic film layer 104, of the first power lines 105 on the base substrate 101. An extension direction of the virtual first organic film layer is parallel to an extension direction of the first organic film layer 104.

Since the lengths of the side edges of the segments, covered by the first organic film layer 104, of the first power lines 105 are greater, the path along which moisture or oxygen enters the pixel units via the first power lines 105 is lengthened to prevent moisture from entering the plurality of pixel units 102.

Referring to FIGS. 10 and 11, orthographic projections of the side edges of the segments, covered by the first organic film layer 104, of the first power lines 105 on the base substrate 101 are broken lines, and each two adjacent segments of each of the broken lines are perpendicular to each other. In the segments, covered by the first organic film layer 104, of the first power lines 105, widths w3 of segments within a region surrounded by a barrier structure 103 are greater than widths w4 of segments outside a region surrounded by the barrier structure 103. That is, the widths of the portions of the first power lines 105 proximal to the display region 101a are greater, and the widths of the portions of the first power lines 105 distal from the display region 101a are less, namely w3>w1>w2>w4. Thus, areas of the regions of the first power lines 105 outside the barrier structure 103 are reduced, and the screen ratio of the display device is increased.

In some embodiments of the present disclosure, referring to FIGS. 1, 4, 6, 7, and 10, the barrier structure 103 is a ring-shaped structure surrounding the display region 101a, and configured to block the overflow of the organic layer in the region surrounded by the barrier structure 103 in the display substrate 10. The barrier structure 103 includes a first barrier dam 1031 and a second barrier dam 1032. The first barrier dam 1031 is distal from the display region 101a relative to the second barrier dam 1032, and a thickness of the first barrier dam 1031 is greater than a thickness of the second barrier dam 1032.

Since the two barrier dams are arranged, and the thickness of the first barrier dam 1031 distal from the display region 101a is greater than the thickness of the second barrier dam 1032 proximal to the display region 101a, the overflow of the organic layer in the region surrounded by the barrier structure 103 is further prevented. The barrier structure 103 also includes one or more than two barrier dams, which is not limited by the embodiments of the present disclosure.

Figure 12:
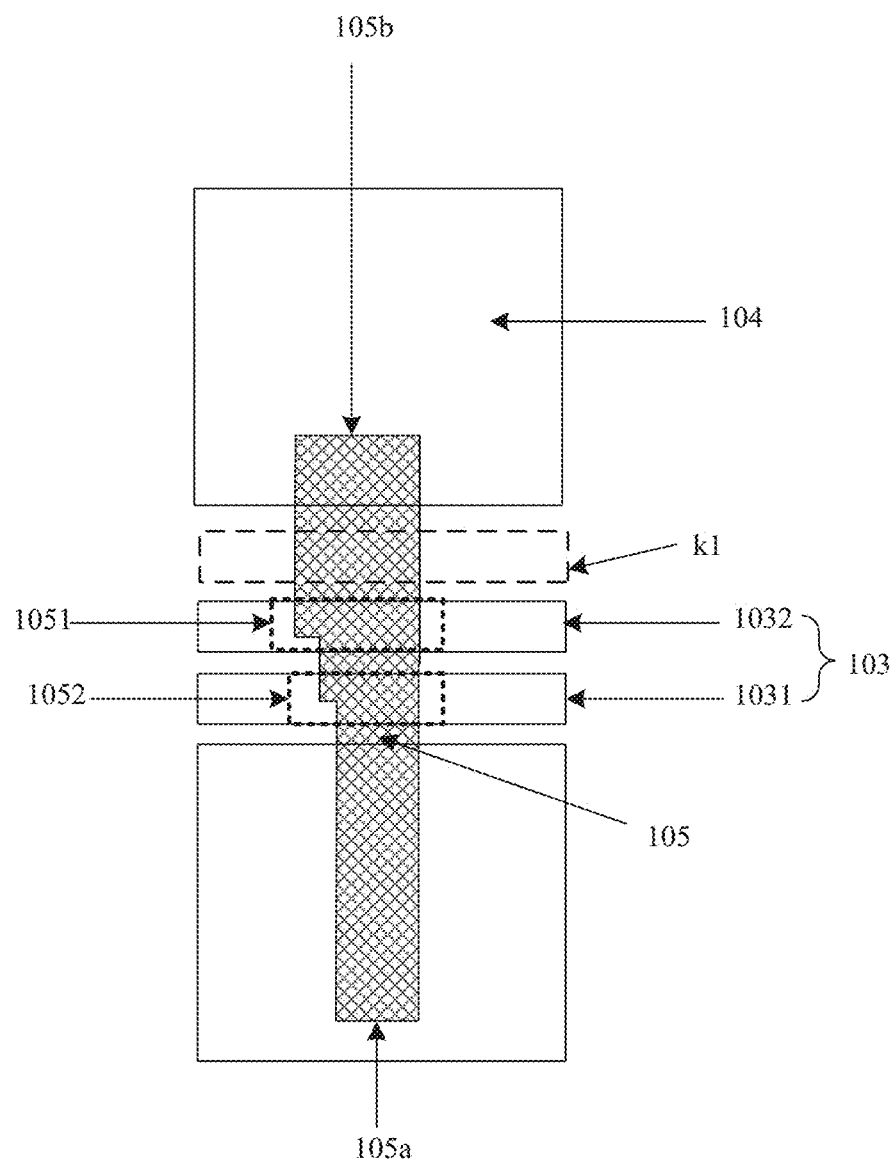
FIG. 12 is a partial schematic structural diagram of the display substrate in FIG. 4.

In some embodiments of the present disclosure, the lengths of the side edges of the segments, covered by the barrier structure 103, of the first power lines 105 are greater than the length of one first bump structure 106. In addition, referring to FIG. 12, the lengths of the side edges of the segments, covered by the barrier structure 103, of first power lines 105 are greater than the lengths of the first bump structures 106 covered by the virtual barrier structure k1. The virtual barrier structure k1 covers one or more bump structures 106.

Figure 13:
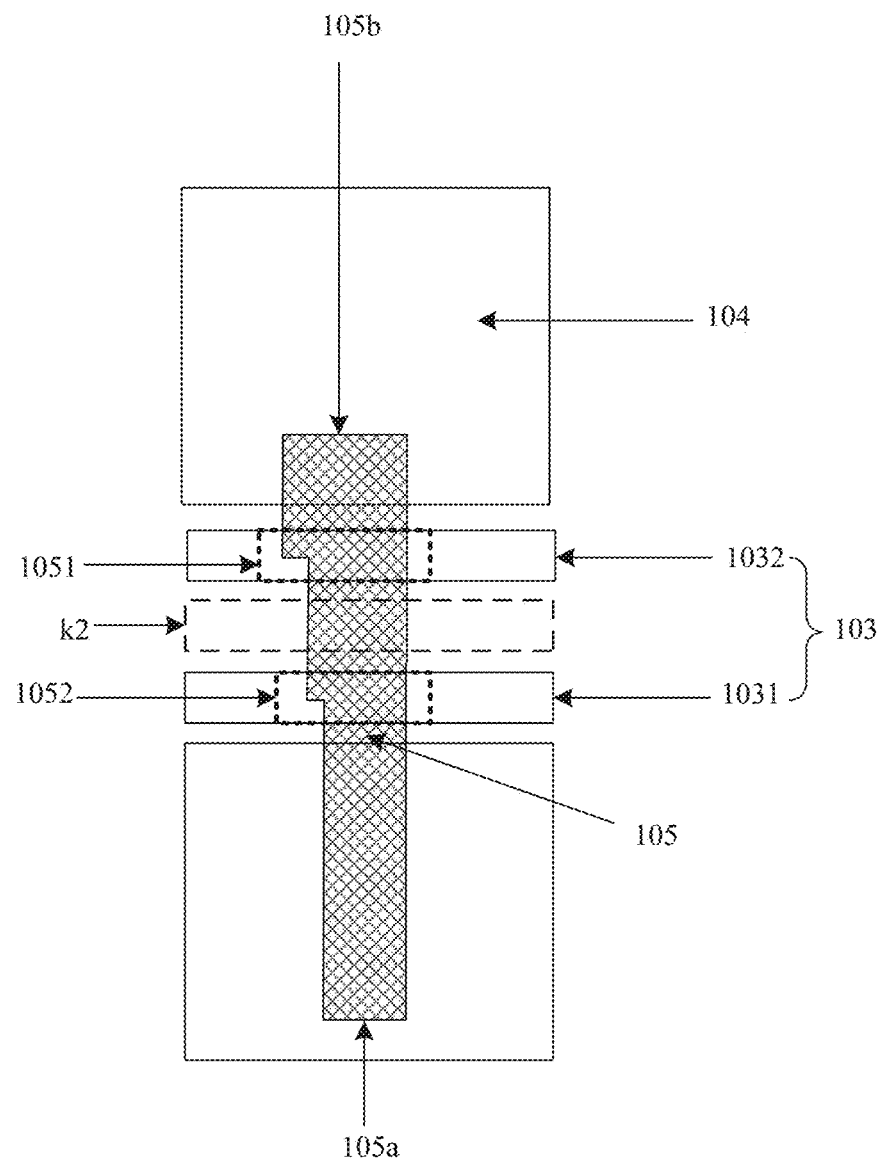
FIG. 13 is a partial schematic structural diagram of another display substrate according to some embodiments of the present disclosure.
Figure 14:
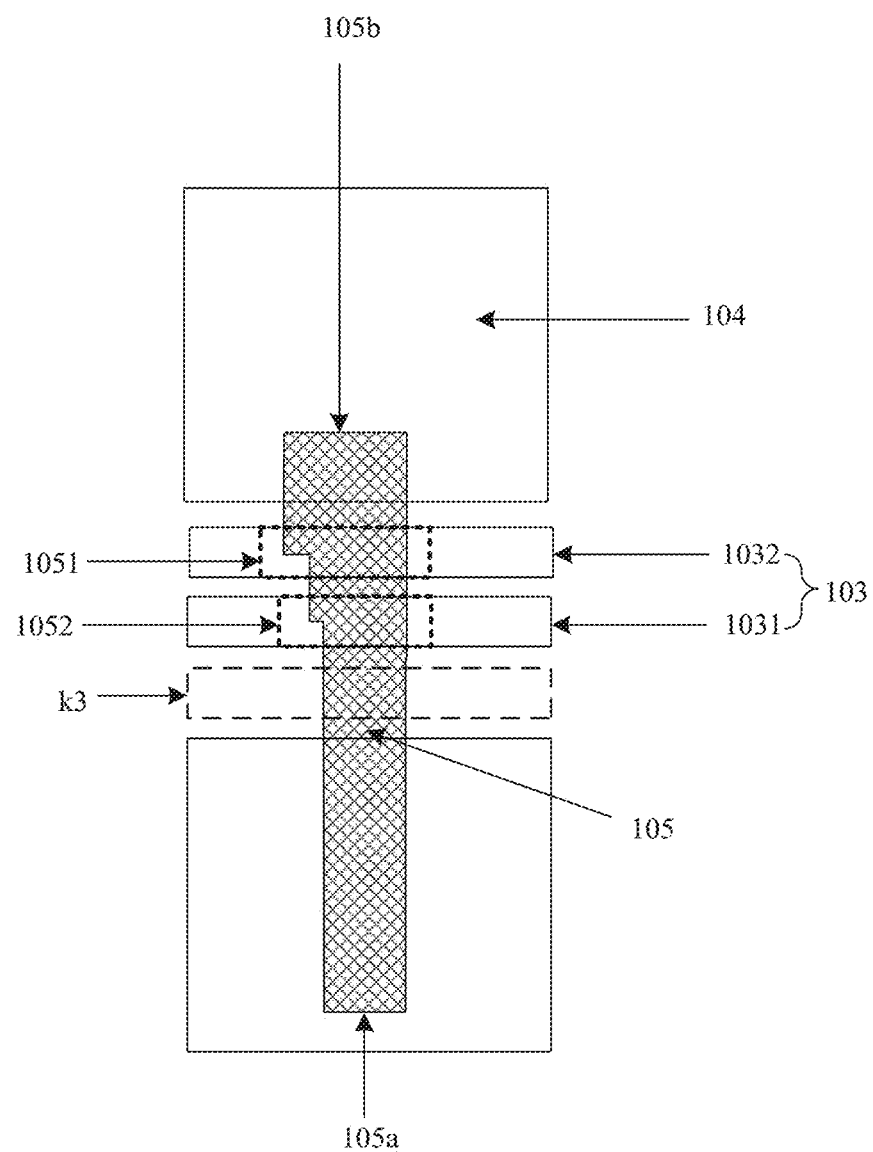
FIG. 14 is a partial schematic structural diagram of still another display substrate according to some embodiments of the present disclosure.

In some embodiments, the virtual barrier structure is disposed at any position. For example, referring to FIGS. 4 and 12, the virtual barrier structure k1 is disposed on a side, proximal to the display region 101a, of the barrier structure 103. In some embodiments, referring to FIG. 13, a virtual barrier structure k2 is disposed between a first barrier dam 1031 and a second barrier dam 1032. In some embodiments, referring to FIG. 14, a virtual barrier structure k3 is disposed on a side, distal from the display region 101a, of the barrier structure 103.

The lengths of the side edges of the segments, covered by the barrier structure 103, of the first power line 105 are greater than the lengths of the side edges of the segments, covered by the virtual barrier structure, of the first power lines 105 at any position. For example, the lengths of the side edges of the segments, covered by the barrier structure 103, of the first power lines 105 are greater than the lengths of the side edges of the segments, covered by the virtual barrier structure k1, of the first power lines 105 in FIGS. 4 and 12. In addition, the lengths of the side edges of the segments, covered by the barrier structure 103, of the first power lines 105 are greater than the lengths of the side edges of the segments, covered by the virtual barrier structure k2, of the first power lines 105 in FIG. 13. In addition, the lengths of the side edges of the segments, covered by the barrier structure 103, of the first power lines 105 are greater than the lengths of the side edges of the segments, covered by the virtual barrier structure k3, of the first power lines 105 in FIG. 14.

Referring to FIGS. 5, 8, 9, and 11 to 14, since the barrier structure 103 includes two barrier dams, each of the first power lines 105 includes a first segment 1051 and a second segment 1052. The first segments 1051 is distal from the display region 101a relative to the second segments 1052. The first segments 1051 are covered by the first barrier dam 1031. The second segments 1052 are covered by the second barrier dam 1032. The lengths of the side edges of the first segments 1051 are greater than the lengths of the side edges of the segments, covered by the virtual barrier structure, of the first power lines 105; and the lengths of the side edges of the second segments 1052 are greater than the lengths of the side edges of the segments, covered by the virtual barrier structure, of the first power lines 105. That is, by setting the lengths of the side edges of the first and second segments to be greater, the path along which moisture or oxygen enters the pixel units is lengthened.

In some embodiments, the lengths of the side edges of the first segments 1051 are 1 to 5 times the lengths of the side edges of the second segments 1052.

In some embodiments of the present disclosure, in the case that the barrier structure 103 includes more barrier dams, the first power lines 105 also include more segments (the length of a side edge of each segment is greater, for example, the orthographic projection of the side edge of each segment on the base substrate 101 is a broken line or a curve), and it is only necessary to ensure that the orthographic projection of the side edge of each segment on the base substrate 101 is covered by one barrier dam.

Referring to FIGS. 1, 4, 6, 7, and 10, the orthographic projections of both the first barrier dam 1031 and the second barrier dam 1032 on the base substrate 101 are ring-shaped, and the first barrier dam 1031 surrounds the second barrier dam 1032.

Referring to FIG. 3, the first barrier dam 1031 includes a first pattern 104a of the first organic film layer 104, a second pattern 107a of a second organic film layer 107, and a third pattern 108a of a third organic film layer 108 that are successively laminated along a side distal from the base substrate 101. The second barrier dam 1032 includes a fourth pattern 107b of the second organic film layer 107 and a fifth pattern 108b of the third organic film layer 108 that are successively laminated along the side distal from the base substrate 101.

The second pattern 107a of the second organic film layer 107 and the fourth pattern 107b of the second organic film layer 107 are prepared using the same material by one patterning process. The third pattern 108a of the third organic film layer 108 and the fifth pattern 108b of the third organic film layer 108 are prepared using the same material by one patterning process.

In some embodiments of the present embodiment, the first organic film layer 104 is a planarization layer (PNL), the second organic film layer 107 is a pixel define layer (PDL), and the third organic film layer 108 is a photo spacer (PS).

In some embodiments, the first organic film layer 104, the second organic film layer 107, and the third organic film layer 108 all are made from an organic material. For example, the first organic film layer 104, the second organic film layer 107, and the third organic film layer 108 are made from a resin material. This is not limited by the embodiments of the present disclosure.

Referring to FIG. 3, the first barrier dam 1031 has one more layer of organic pattern than the second barrier dam 1032, such that a thickness of the first barrier dam 1031 is greater than a thickness of the second barrier dam 1032 to prevent overflow of the organic layers.

Figure 15:
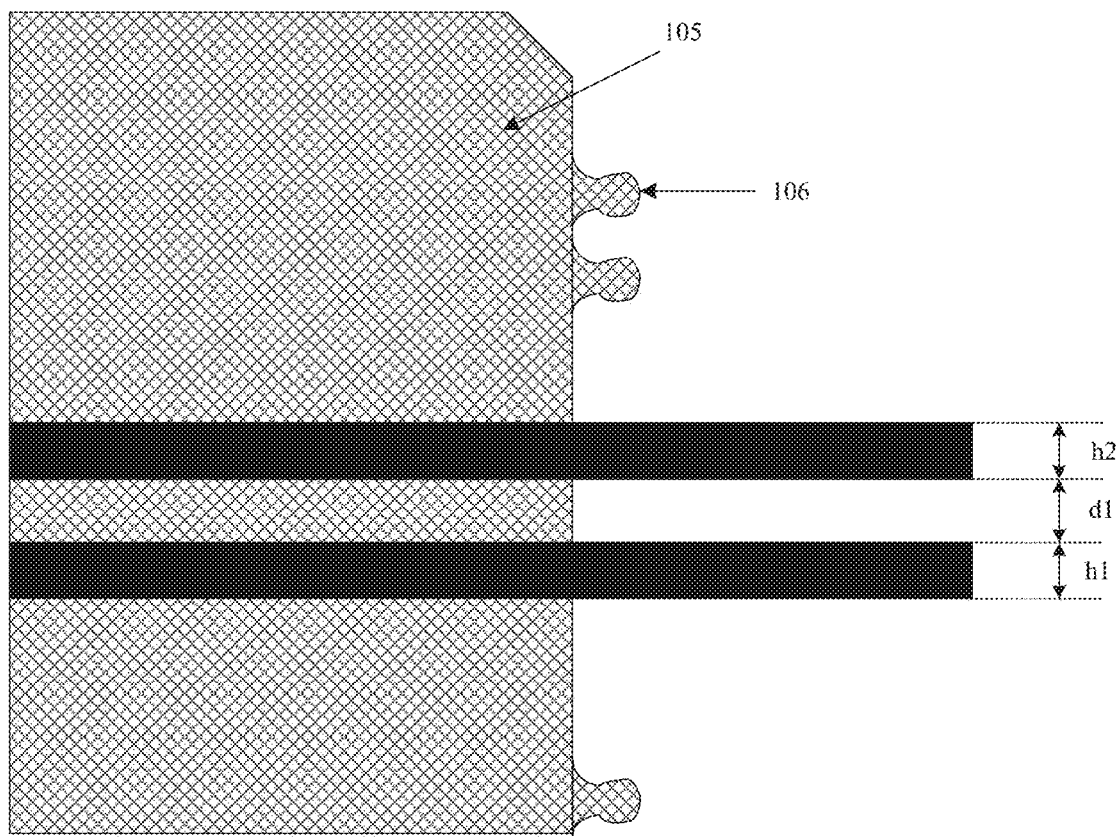
FIG. 15 is a schematic structural diagram of a first power line and a barrier structure according to some embodiments of the present disclosure.

FIG. 15 is a schematic diagram of a first power line and a barrier structure according to some embodiments of the present disclosure. Referring to FIG. 15, a width h1 of a first barrier dam 1031 is greater than or equal to a first width threshold, and a width h2 of a second barrier dam 1032 is greater than or equal to a second width threshold. A first distance d1 between the first barrier dam 1031 and the second barrier dam 1032 in the extension direction of the first power lines 105 is greater than or equal to a first distance threshold.

In some embodiments, the first width threshold, the second width threshold and the first distance threshold all are 40 µm. That is, the width h1 of the first barrier dam 1031, the width h2 of the second barrier dam 1032, and the first distance d1 are all greater than or equal to 40 µm.

Figure 16:
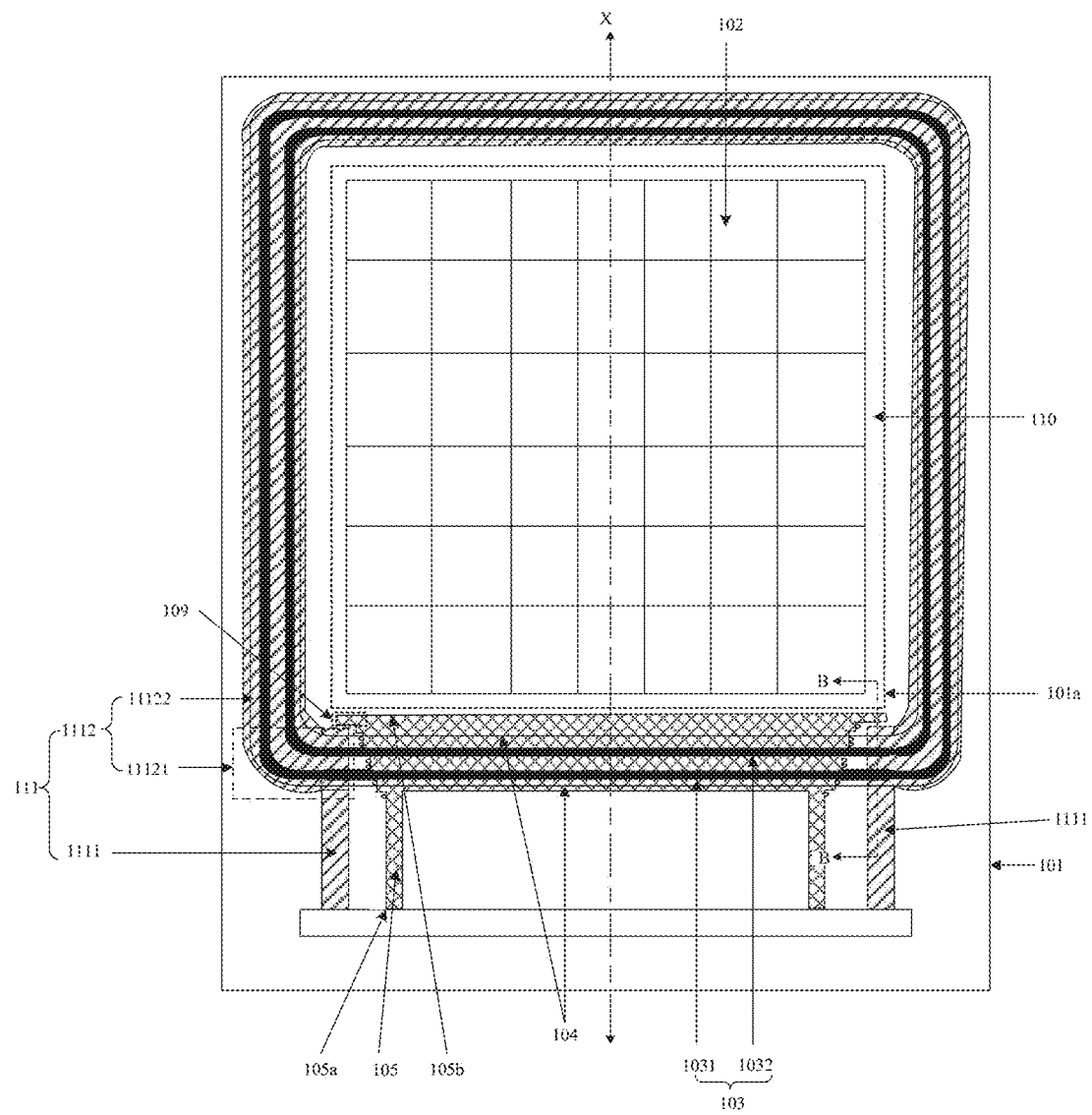
FIG. 16 is a schematic structural diagram of yet still another display substrate according to some embodiments of the present disclosure.
Figure 17:
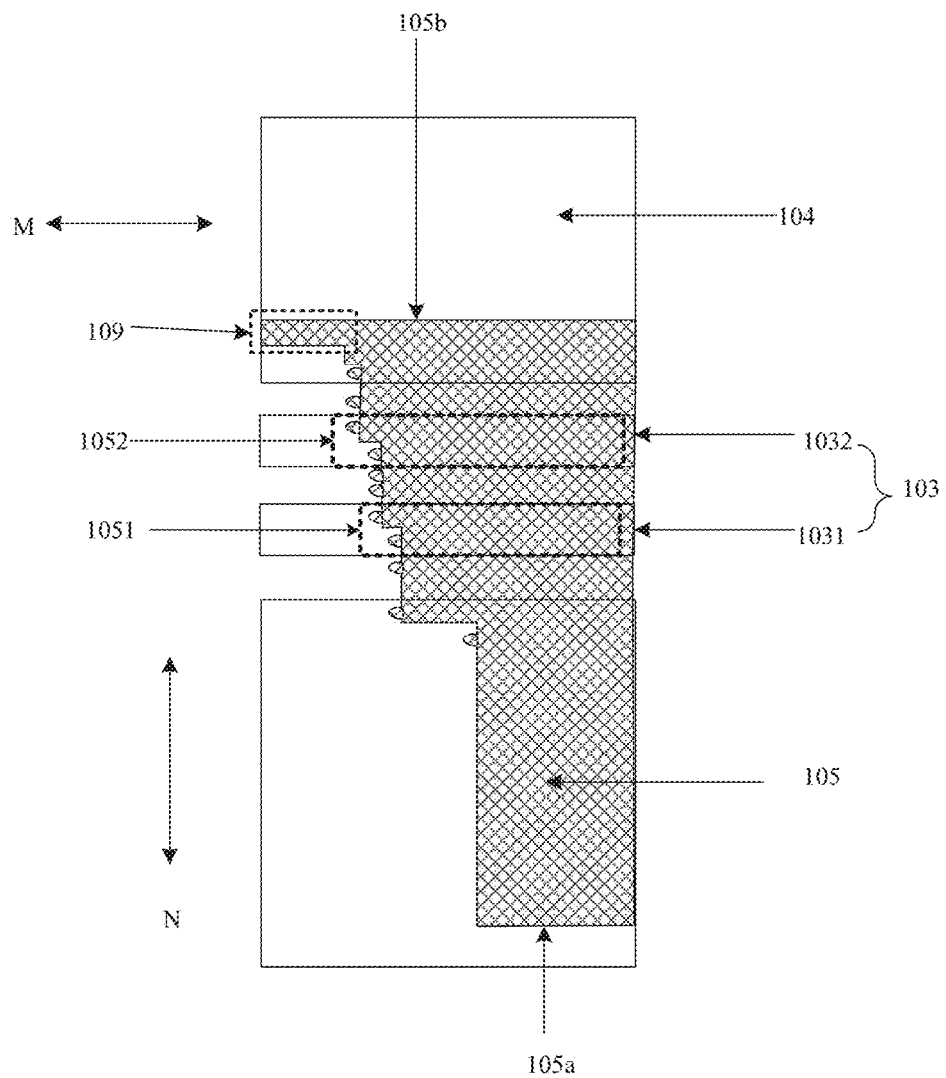
FIG. 17 is a partial schematic structural diagram of the display substrate in FIG. 16.
Figure 18:
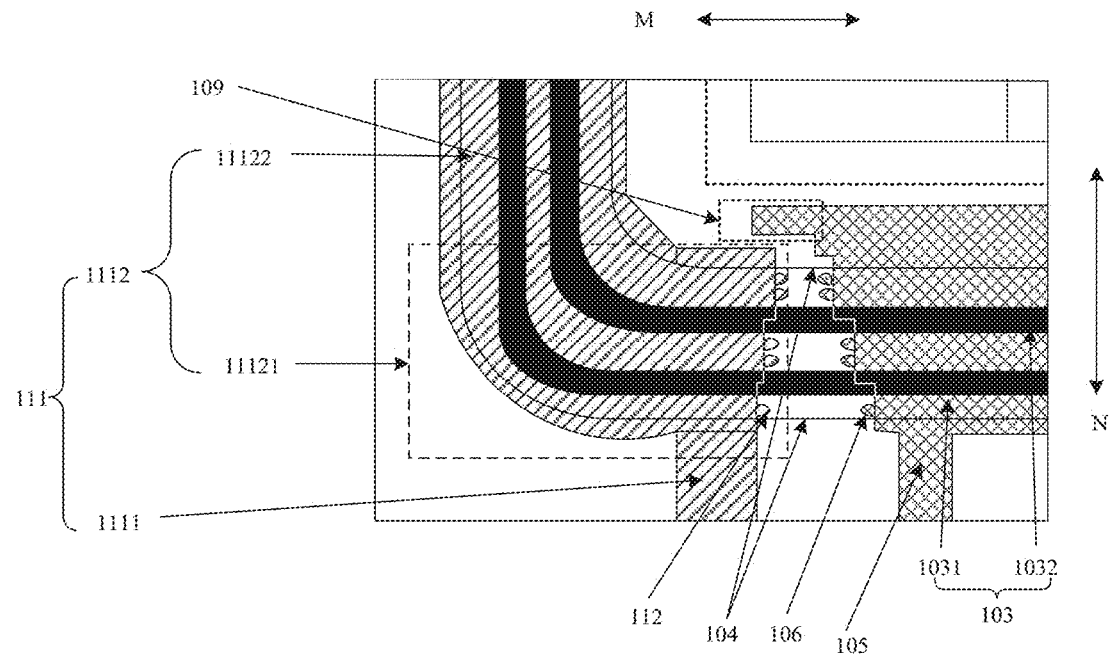
FIG. 18 is a partial schematic structural diagram of yet still another display substrate according to some embodiments of the present disclosure.

FIG. 16 is a schematic structural diagram of yet still another display substrate according to some embodiments of the present disclosure. FIG. 17 is a partial schematic structural diagram of the display substrate illustrated in FIG. 16. FIG. 18 is a partial schematic structural diagram of a display substrate according to some embodiments of the present disclosure. Referring to FIGS. 16 to 18, the display substrate 10 further includes at least one extending structure 109. The extending structure 109 is disposed on a side, proximal to the display region 101a, of the barrier structure 103, and is connected to a side edge of the other end 105b of one first power line 105. An extension direction M of the extending structure 109 is perpendicular to an extension direction N of the first power line 105.

Generally, the first power signal received by the first power line 105 needs to be transmitted to each pixel unit 102 in the display region 101a, the distances between the pixel units 102 in the middle of the display region 101a and the first power line 105 are less, and the distances between the pixel units 102 at the boundary of the display region 101a and the first power line 105 are greater. This results in lower reliability of the first power signal received by the pixel units 102 at the boundary of the display region 101a.

Therefore, in some embodiments of the present disclosure, the extending structure 109 is arranged on the side edge of the other end 105b of the first power line 105, and the first power signal received by the first power line 105 is transmitted to the pixel units 102 at the boundary of the display region 101a via the extending structure 109, such that the reliability of the first power signal received by the pixel units 102 at the boundary of the display region 101a is ensured, and thus the display effect of the display device is ensured.

In some embodiments, at least one strip-shaped extending structure 109 and the first power line 105 are prepared using the same material by one patterning process, and the at least one strip-shaped extending structure 109 and the first power line 105 are integrated.

Referring to FIGS. 1, 4, 6, 7, and 10, the display substrate 10 includes two first power lines 105, wherein the two first power lines 105 are arranged axially symmetrically about an axis X of the base substrate 101. In addition, referring to FIG. 16, the other ends 105b of the two first power lines 105 are integrated, such that the first power signals transmitted from the two first power lines 105 to the pixel units 102 in the display region 101a are consistent, and thus the display effect of the display device is ensured.

Figure 19:
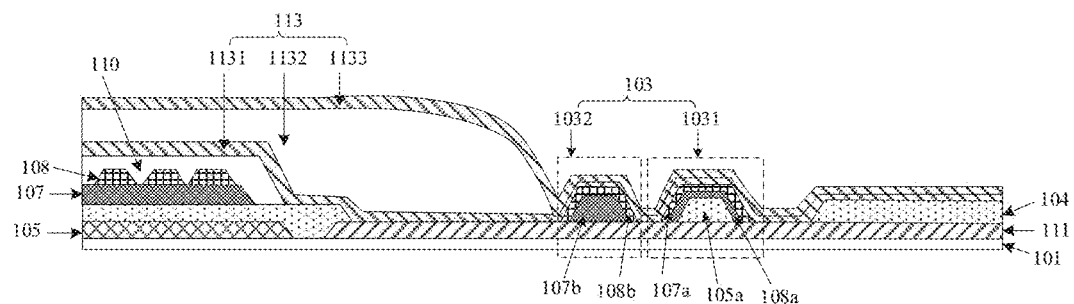
FIG. 19 is a cross-sectional view of the display substrate in FIG. 16 in a B-B direction.

FIG. 19 is a cross-sectional view of FIG. 16 in a B-B direction. Referring to FIGS. 3 and 19, the display substrate 10 further includes a cathode layer 110. The cathode layer 110 is disposed on a side, distal from the base substrate 101, of the first organic film layer 104. Furthermore, an orthographic projection of the cathode layer 110 on the base substrate 101 covers the display region 101a, and the orthographic projection of the cathode layer 110 on the base substrate 101 is within the region surrounded by the barrier structure 103.

Referring to FIGS. 1, 4, 6, 7, 10, 16, and 18, the display substrate 10 further includes: a second power line 111. The second power line 111 is disposed in the same layer as the first power lines 105. The second power line 111 includes first portions 1111 and a second portion 1112. The first portions 1111 are disposed on the side, distal from the display region 101a, of the barrier structure 103, and configured to receive the second power signal. For example, the first portions 1111 are connected to a power drive circuit, and configured to receive the second power signal supplied by the power drive circuit. The second portion 1112 surrounds the display region 101a. An orthographic projection of the second portion 1112 on the base substrate 101 is overlapped with the orthographic projection of the barrier structure 103 on the base substrate 101. The second portion 1112 is connected to the cathode layer 110.

In some embodiments, the first portion 1111 is in direct contact with the second portion 1112. For example, the first portions 1111 are integrated with the second portion 1112.

Since the second portion 1112 of the second power line 111 is connected to the cathode layer 110, and configured to supply the second power signal to the cathode layer 110, and the second power signal received by the cathode layer 110 is a negative power signal, the second power line 111 is also referred to as a VSS power line or a VSS trace.

Referring to FIG. 18, a display substrate 10 further includes: a plurality of second bump structures 112 disposed on side edges of connecting portions 11121. By arranging the plurality of second bump structures 112 on side edges of second power line 111, the path along which moisture or oxygen enters via the second power line 111 is further lengthened to prevent moisture or oxygen from entering a plurality of pixel units 102 via the second power line 111. The plurality of second bump structures 112 and the second power line 111 are prepared using the same material by one patterning process, and the plurality of second bump structures 112 are integrated with the second power line 111.

In some embodiments, referring to FIG. 18, orthographic projections of the second bump structures 112 on a base substrate 101 are not overlapped with an orthographic projection of a first organic film layer 104 on the base substrate 101; and the orthographic projections of the second bump structures 112 on the base substrate 101 are not overlapped with an orthographic projection of a barrier structure 103 on the base substrate 101. That is, the second bump structures 112 are arranged on side edges of portions of the second power line 111 that are not covered by the first organic film layer 104 and the barrier structure 103, and thus the risk of corrosion of the portions of the second power line 111 that are not covered by the first organic film layer 104 and the barrier structure 103 is reduced to ensure the quality of the second power line 111.

The orthographic projections of the second bump structures 112 on the base substrate 101 are also overlapped with orthographic projections of the barrier structure 103 and the first organic film layer 104 on the base substrate 101. That is, the second bump structures 112 are arranged on side edges of portions, covered by the first organic film layer 104, of the second power line 111, or side edges of portions, covered by the barrier structure 103, of the second power line 111, in addition to the side edges of the portions, uncovered by the first organic film layer 104 and the barrier structure 103, of the second power line 111, such that the path along which moisture enters is further lengthened to ensure the yield of the display substrate 10.

Referring to FIGS. 1, 4, 6, 7, 10, 16, and 18, the second portion 1112 of the second power line 111 further includes: the connecting portions 11121 and a surrounding portion 11122. The connecting portions are connected to the first portions 1111 and the surrounding portion 11122; the surrounding portion 11122 surrounds the display region 101a; and the surrounding portion 11122 is distal from the first portions 1111 relative to the connecting portion 11121. Furthermore, the surrounding portion 11122 is an unclosed structure, for example, in FIGS. 1, 4, 6, 7, and 10, the surrounding portion 11122 surrounds three edges of the display region 101a.

Lengths of side edges of portions, covered by the barrier structure 103, of the connecting portions 11121 are greater than lengths of side edges of portions, covered by the virtual barrier structure, of the connecting portions 11121. In an exemplary embodiment, referring to FIG. 18, orthographic projections of the side edges of the portions, covered by the barrier structure 103, of the connecting portions 11121 on the base substrate 101 are broken lines or curves.

In some embodiments of the present disclosure, since the orthographic projections of the side edges of the portions, covered by the barrier structure 103, of the connecting portions 11121 on the base substrate 101 are broken lines or curves, the path along which moisture or oxygen enters via the second power line 111 is lengthened, such that moisture or oxygen is prevented from entering the pixel units 102 via the second power line 111.

In some embodiments, referring to FIG. 18, the orthographic projections of the side edges of the portions, covered by the barrier structure 103, of the connecting portions 11121 on the base substrate 101 are broken lines, and each two adjacent segments of each of the broken lines are perpendicular to each other. That is, the side edges of the connecting portions 11121 are step-shaped.

In some embodiments of the present disclosure, the lengths of the side edges of the portions, covered by the barrier structure 103, of the connecting portions 11121 are also less than or equal to perimeters, covered by the barrier structure 103 with the equal width, of the second bump structures 112. For example, referring to FIGS. 1, 4, 6, 7, 10, and 16, the orthographic projections of the side edges of the portions, covered by the barrier structure 103, of the connecting portions 11121 on the base substrate 101 are also straight lines, and the straight lines are parallel to the extension direction N of the first power lines 105.

A second distance d2 between the first power lines 105 and the connecting portions 11121 is greater than or equal to a second distance threshold; a third distance d3 between the first power lines 105 and the connecting portions 11121 is greater than or equal to a third distance threshold; and a fourth distance d4 between the first power lines 105 and the connecting portions 11121 is greater than or equal to a fourth distance threshold.

Figure 20:
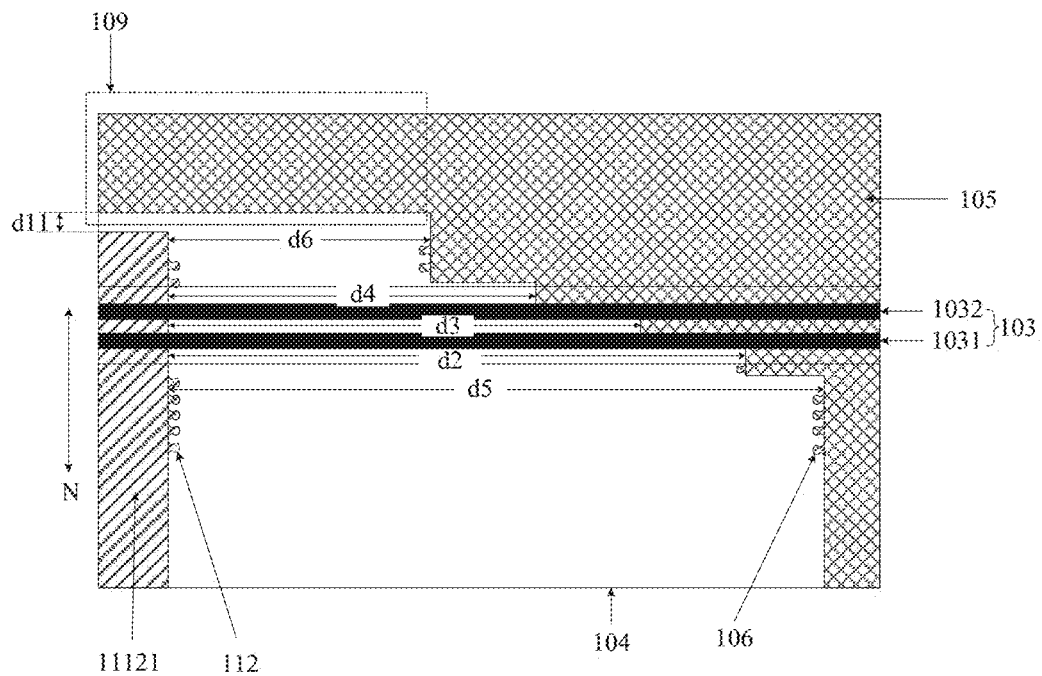
FIG. 20 is a schematic structural diagram of a first power line and a connecting according to some embodiments of the present disclosure.

Referring to FIG. 20, the second distance d2 is a maximum distance between segments, covered by a first barrier dam 1031, of the first power lines 105 and the connecting portions 11121 in a direction perpendicular to the extension direction N of the first power lines 105. The third distance d3 is a maximum distance between segments of the first power lines 105, which are disposed between the first barrier dam 1031 and a second barrier dam 1032, and the connecting portions 11121 in the direction perpendicular to the extension direction N of the first power lines 105. The fourth distance d4 is a maximum distance between segments, covered by the second barrier dam 1032, of the first power lines 105 and the connecting portions 11121 in the direction perpendicular to the extension direction N of the first power lines 105.

In some embodiments, the second threshold is greater than the third threshold, and the third threshold is greater than the fourth threshold. That is, the second distance d2 is greater than the third distance d3, and the third distance d3 is greater than the fourth distance d4, namely d2>d3>d4.

In some embodiments of the present disclosure, a fifth distance d5 between the first power lines 105 and the connecting portions 11121 is greater than or equal to a fifth distance threshold; and a sixth distance d6 between the first power lines 105 and the connecting portions 11121 is greater than or equal to a sixth distance threshold.

The fifth distance d5 is a maximum distance between the segments, covered by the first organic film layer 104 and disposed outside the region surrounded by the barrier structure 103 of the first power lines 105 and the connecting portions 11121 in the direction perpendicular to the extension direction N of the first power lines 105. The six distance d6 is a maximum distance between the segments, covered by the first organic film layer 104 and disposed in the region surrounded by the barrier structure 103, of the first power lines 105 and the connecting portions 11121 in the direction perpendicular to the extension direction N of the first power lines 105.

In some embodiments, the fifth threshold is greater than the second threshold, and the sixth threshold is less than the fourth threshold. That is, the fifth distance d5 is greater than the second distance d2, and the fourth distance d4 is greater than the sixth distance d6, namely d5>d2>d3>d4>d6.

In some embodiments of the present disclosure, the second distance threshold is 3323 μm, the third distance threshold is 2723 μm, the fourth distance threshold is 2123 μm, the fifth distance threshold is 3795 μm, and the sixth distance threshold is 1523 μm.

Since the second distance d2, the third distance d3, the fourth distance d4, the fifth distance d5 and the sixth distance d6 are all greater, coupling capacitance generated by the first power lines 105 and the second power line 111 is reduced, and thus the display effect of the display device is ensured.

In some embodiments of the present disclosure, for clear illustration of the second distance d2, the third distance d3 and the fourth distance d4, FIG. 20 does not illustrate the first bump structures 106 arranged on the side edges of the portions of the first power lines 105 that are not covered by the first organic film layer 104.

Referring to FIGS. 16 and 18, the connecting portions 11121 are distal from the display region 101a relative to the extending structure 109. That is, the connecting portions 11121 are further from the display region 101a, and the extending structure 109 is proximal to the display region 101a, such that the first power lines 105 conveniently transmit the first power signal to the pixel units 102 in the display region 101a via the extending structure 109.

Referring to FIGS. 16 and 18, the orthographic projections of the side edges of the portions, covered by the barrier structure 103, of the first power lines 105 on the base substrate 101 are broken lines, and the orthographic projections of the side edges of the segments, covered by the first organic film layer 104, of the first power lines 105 on the base substrate 101 are broken lines.

Figure 21:
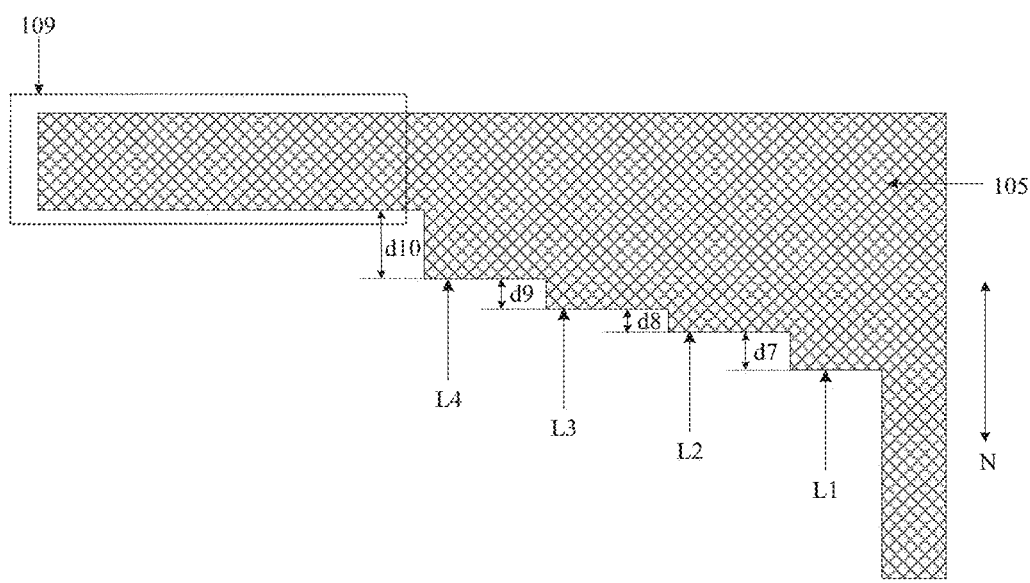
FIG. 21 is a schematic structural diagram of a first power line according to some embodiments of the present disclosure.

Referring to FIG. 21, a seventh distance d7 between a first step line L1 and a second step line L2 of the first power line 105 in the extension direction N of the first power line 105 is greater than or equal to a seventh distance threshold. An eighth distance d8 between the second step line L2 and a third step line L3 of the first power line 105 in the extension direction N of the first power line 105 is greater than or equal to an eighth distance threshold. A ninth distance d9 between the third step line L3 and a fourth step line L4 of the first power line 105 in the extension direction N of the first power line 105 is greater than or equal to a ninth distance threshold. A tenth distance d10 between the fourth step line L4 and the extending structure 109 in the extension direction N of the first power line 105 is greater than or equal to a tenth distance threshold.

Referring to FIGS. 20 and 21, the first step line L1 is covered by the first organic film layer 104 outside the region surrounded by the barrier structure 103. The second step line L2 is covered by the first barrier dam 1031 of the barrier structure 103. The third step line L3 is covered by the second barrier dam 1032 of the barrier structure 103. The fourth step line L4 is covered by the first organic film layer 104 in the region surrounded by the barrier structure 103. The first step line L1, the second step line L2, the third step line L3, and the fourth step line L4 are all perpendicular to the extension direction N of the first power line 105.

In some embodiments, the seventh distance threshold is 140 μm, the eighth distance threshold is 80 μm, the ninth distance threshold is 110 μm, and the tenth distance threshold is 275 μm.

In some embodiments of the present disclosure, referring to FIG. 20, an eleventh distance d11 between the extending structure 109 and the connecting portion 11121 in the extension direction N of the first power line 105 is greater than an eleventh distance threshold. In some embodiments, the eleventh distance threshold is 80 μm.

Due to the greater eleventh distance d11, coupling capacitance generated by the extending structure 109 and the second power line 111 is reduced, and thus the display effect of the display device is ensured.

In some embodiments of the present disclosure, the first organic film layer 104 covers the first portions 1111 of the second power line 111, boundaries, proximal to the display region 101a, of the second portions 1112 of the second power line 111, and boundaries, distal from the display region 101a, of the second portions 1112. Therefore, corrosion of the boundaries of the second portions 1112 of the second power line 111 and the first portions 1111 is avoided to ensure the quality of the second power line 111.

In some embodiments of the present disclosure, FIGS. 4, 5, 6, 7, 8, 9, 10, 11, 12, 13, 14, 16, 17, 18, and 20 illustrate the organic film layer 104 using the boundary of the first organic film layer 104 rather than a hatched pattern. A structure of the first organic film layer 104 is seen in FIG. 2.

Referring to FIG. 16, the second power line 111 includes two first portions 1111, wherein one of the first portions 1111 is connected to one end of the second connecting portion 1112, and the other of the first portions 1111 is connected to the other end of the second connecting portion 1112. The two first portions 1111 are arranged axially symmetrically about the axis X of the base substrate 101.

In some embodiments, one end 105a of the first power line 105 is disposed between the two first portions 1111. Exemplarily, FIG. 16 illustrates two first power lines 105, and both the ends 105a of the two first power lines 105 are disposed between the two first portions 1111.

Referring to FIGS. 3 and 19, the display substrate 10 further includes: a packaging film layer 113. The packaging film layer 113 is disposed on the side, distal from the base substrate 101, of the first organic film layer 104; and the packaging film layer 113 covers the region surrounded by the barrier structure 103. Referring to FIG. 3, a boundary, covered by the packaging film layer 113, of a region 113a is disposed on a side of the barrier structure 103 distal from the plurality of pixel units 102.

In some embodiments of the present disclosure, the packaging film layer 113 includes a first film layer 1131, a second film layer 1132, and a third film layer 1133 that are successively laminated along a direction distal from the base substrate 101.

In some embodiments, the first film layer 1131 and the third film layer 1133 are made of an inorganic material, and the second film layer 1132 is made of an organic material. For example, the first film layer 1131 and the third film layer 1133 are made of one or more inorganic oxides such as SiNx, SiOx, and SiOxNy. The second film layer 1132 is made of a resin material. The resin material is thermoplastic resin or thermosetting resin, the thermoplastic resin includes polymethyl methacrylate (PMMA) resin, and the thermosetting resin includes epoxy resin.

It is noted that the second film layer 1132 is disposed in the region surrounded by the barrier structure 103, and the first film layer 1131 and the third film layer 1133 cover the region surrounded by the barrier structure 103 and cover the barrier structure 103. That is, the orthographic projection of the barrier structure 103 on the base substrate 101 is disposed in the region covered by the packaging film layer 113, which ensures that all structures in the region surrounded by the barrier structure 103 are effectively packaged by the packaging film layer 113.

In some embodiments of the present disclosure, the second film layer 1132 is made by ink jet printing (IJP). The first film layer 1131 and the second film layer 1133 are made by chemical vapor deposition (CVD).

Figure 22:
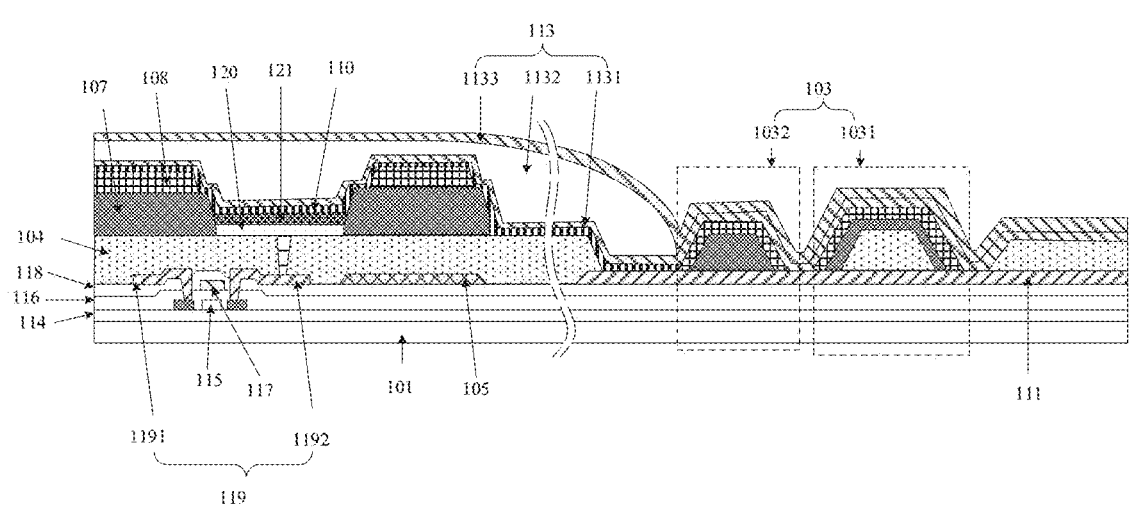
FIG. 22 is a schematic structural diagram of yet another display substrate according to some embodiments of the present disclosure.

FIG. 22 is a schematic structural diagram of yet another display substrate according to some embodiments of the present disclosure. Referring to FIG. 22, the display substrate further includes a buffer layer 114, a semiconductor layer 115, a gate insulating layer 116, a gate 117, an interlayer dielectric layer 118, and a source-drain layer 119 that are successively laminated along a direction away from the base substrate 101. The source-drain layer 119 includes a source 1191 and a drain 1192. The source 1191 and the drain 1192 are spaced apart from each other and are connected to the semiconductor layer 115 via holes. A first organic film layer 104, an anode layer 120, a light-emitting layer 121 and the cathode layer 110 are successively arranged along a direction of the source-drain layer 119 away from the base substrate 101. The anode layer 120, the light-emitting layer 121, and the cathode layer 110 constitute a light-emitting element. The anode layer 120 is electrically connected to the drain 1192 via a via hole. The gate 117, the source 1191, and the drain 1192 constitute a transistor, and each light-emitting element and the transistor connected to the light-emitting element constitute one pixel unit 102.

Referring to FIG. 22, a first power line 105 is disposed in a same layer as a second power line 111 and the source-drain layer 119. The first power line 105, the second power line 111, and the source-drain layer 119 include three film layers, for example, materials of the three film layers are titanium (Ti), aluminum (Al), and titanium (Ti) in sequence.

In summary, the embodiments of the present disclosure provide a display substrate. The length of the side edge of the segment, covered by the barrier structure, of the first power line in the display substrate is greater, such that the path along which moisture or oxygen enters via the first power line is lengthened, and hence moisture or oxygen is prevented from entering the pixel units. In addition, since the segment, with the longer side edge, of the first power line, is covered by the barrier structure, the first power line is prevented from corrosion due to the longer exposed segment of the first power line, and the quality of the first power line is ensured. Thus, the yield of the display substrate is ensured, and the display effect of the display device is improved.

Figure 23:
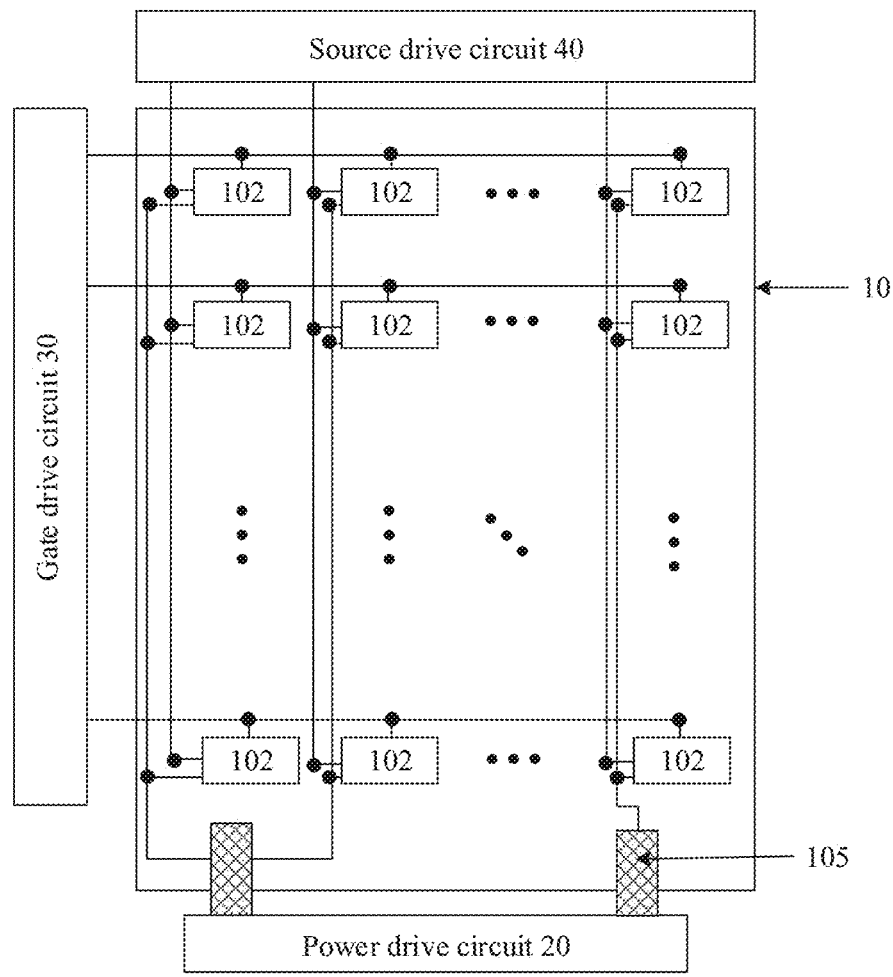
FIG. 23 is a schematic structural diagram of a display device according to some embodiments of the present disclosure.

FIG. 23 is a schematic structural diagram of a display device according to some embodiments of the present disclosure. Referring to FIG. 23, the display device includes a power drive circuit 20, and the display substrate 10 according to the above embodiments.

The power drive circuit 20 is connected to at least one first power line 105 in the display substrate 10, and configured to supply the first power signal to the first power line 105. The first power line 105 is configured to supply the first power signal from the power drive circuit 20 to the pixel units 102 connected to the first power line 105. In an exemplary embodiment of the present disclosure, FIG. 23 illustrates two first power lines 105, and the power drive circuit 20 is connected to both the first power lines 105.

In some embodiments, referring to FIG. 23, the display device further includes a gate drive circuit 30 and a source drive circuit 40. The gate drive circuit 30 is connected to each row of pixel units 102 in the display panel 10 via a gate line, and configured to supply a gate drive signal to each row of pixel units 102. The source drive circuit 40 is connected to each column of pixel units 102 in the display panel 10 via a data line, and configured to supply a data signal to each column of pixel units 102.

In some embodiments of the present disclosure, the display device is any product or component having a display function, such as a liquid crystal display device, electronic paper, a passive-matrix organic light-emitting diode (PMOLED) display device, an active-matrix organic light-emitting diode (AMOLED) display device, a mobile phone, a tablet computer, a TV, a displayer, a notebook computer, a digital photo frame, or a navigator.

Described above are merely the exemplary embodiments of the present disclosure and are not intended to limit the present disclosure. Within the spirit and principle of the present disclosure, any modifications, equivalent substitutions, improvements and the like are within the scope of protection of the present disclosure.

What is claimed is:

1. A display substrate, comprising:
    a base substrate, provided with a display region;
    a plurality of pixel units, disposed in the display region;
    a barrier structure, surrounding the display region;
    a first organic film layer, disposed on one side of the base substrate, wherein a gap is defined between an orthographic projection of the first organic film layer on the base substrate and an orthographic projection of the barrier structure on the base substrate; and
    at least one first power line, disposed on a side, proximal to the base substrate, of the first organic film layer, wherein one end of the first power line is disposed on a side, distal from the display region, of the barrier structure and configured to receive a first power signal, and the other end of the first power line is disposed on a side, proximal to the display region of the barrier structure and connected to the plurality of pixel units;
    wherein a length of a side edge of a segment, covered by the barrier structure, of the first power line is greater than a length of a side edge of a segment, covered by a virtual barrier structure with an equal width, of the first power line, and an extension direction of the virtual barrier structure is parallel to an extension direction of the barrier structure.

2. The display substrate according to claim 1, wherein a plurality of first bump structures are disposed on a side edge of the first power line.

3. The display substrate according to claim 2, wherein the display substrate meets at least one of following:
    the length of the side edge of the segment, covered by the barrier structure, of the first power line is greater than a length of one of the first bump structures; or
    the length of the side edge of the segment, covered by the barrier structure, of the first power line is greater than a length of one of the first bump structures covered by the virtual barrier structure.

4. The display substrate according to claim 2, wherein an orthographic projection of one of the first bump structures on the base substrate is not overlapped with the orthographic projection of the first organic film layer on the base substrate, and is not overlapped with the orthographic projection of the barrier structure on the base substrate.

5. The display substrate according to claim 1, wherein the display substrate meets at least one of following:
    the length of the side edge of the segment, covered by the barrier structure, of the first power line is greater than the length of the side edge of the segment, covered by the virtual barrier structure, of the first power line at any position;
    a difference between the length of the side edge of the segment, covered by the barrier structure, of the first power line and the length of the side edge of the segment, covered by the virtual barrier structure, of the first power line is greater than 400 μm; or
    the length of the side edge of the segment, covered by the barrier structure, of the first power line is greater than 5 times a width of the barrier structure.

6. The display substrate according to claim 1, wherein the display substrate meets at least one of following:

an orthographic projection of a side edge of a portion, covered by the barrier structure, of the first power line on the base substrate is a broken line, and each two adjacent segments of the broken line are perpendicular to each other; or in segments, covered by the barrier structure, of the first power line, a width of a portion proximal to the display region is greater than a width of a portion distal from the display region.

7. The display substrate according to claim 1, wherein a length of a side edge of a segment, covered by the first organic film layer, of the first power line is greater than a length of a side edge of a segment, covered by a virtual first organic film layer with an equal width, of the first power line; and an extension direction of the virtual first organic film layer is parallel to an extension direction of the first organic film layer.

8. The display substrate according to claim 7, wherein in segments, covered by the first organic film layer, of the first power line, a width of a segment in a region surrounded by the barrier structure is greater than a width of a segment outside the region surrounded by the barrier structure.

9. The display substrate according to claim 1, wherein the barrier structure comprises: a first barrier dam and a second barrier dam;

wherein the first barrier dam is distal from the display region relative to the second barrier dam, and a thickness of the first barrier dam is greater than a thickness of the second barrier dam.

10. The display substrate according to claim 9, wherein a width of the first barrier dam is greater than or equal to a first width threshold, and a width of the second barrier dam is greater than or equal to a second width threshold.

11. The display substrate according to claim 9, wherein the first power line comprises: a first segment and a second segment;

wherein the first segment is distal from the display region relative to the second segment and is covered by the first barrier dam, the second segment is covered by the second barrier dam, a length of a side edge of the first segment is greater than the length of the side edge of the segment, covered by the virtual barrier structure, of the first power line, and a length of a side edge of the second segment is greater than the length of the side edge of the segment, covered by the virtual barrier structure, of the first power line.

12. The display substrate according to claim 9, wherein the first barrier dam comprises: a first pattern of the first organic film layer, a second pattern of a second organic film layer, and a third pattern of a third organic film layer that are successively laminated along a side distal from the base substrate; and the second barrier dam comprises: a fourth pattern of the second organic film layer and a fifth pattern of the third organic film layer that are successively laminated along the side distal from the base substrate.

13. The display substrate according to claim 1, further comprising: at least one strip-shaped extending structure; wherein the strip-shaped extending structure is disposed on a side, proximal to the display region, of the barrier structure and connected to a side edge of the other end of the one first power line, and an extension direction of the extending structure is perpendicular to an extension direction of the first power line.

14. The display substrate according to claim 1, comprising: two first power lines; wherein the two first power lines are arranged axially symmetrically about an axis of the base substrate.

15. The display substrate according to claim 14, wherein the other ends of the two first power lines are integrally formed.

16. The display substrate according to claim 1, further comprising: a cathode layer and a second power line; wherein the cathode layer is disposed on a side, distal from the base substrate, of the first organic film layer;

the second power line is disposed in a same layer as the first power line, and the second power line comprises: a first portion and a second portion;

wherein the first portion is disposed on the side, distal from the display region, of the barrier structure and configured to receive a second power signal, the second portion surrounds the display region, an orthographic projection of the second portion on the base substrate is overlapped with the orthographic projection of the barrier structure on the base substrate, and the second portion is connected to the cathode layer.

17. The display substrate according to claim 16, further comprising: a plurality of second bump structures disposed on a side edge of a connecting portion.

18. The display substrate according to claim 16, wherein the second portion of the second power line comprises: a connecting portion and a surrounding portion;

wherein the connecting portion is connected to the first portion and the surrounding portion; the surrounding portion surrounds the display region; an orthographic projection of the side edge of the portion, covered by the barrier structure, of the connecting portion on the base substrate is a straight line, the straight line being parallel to the extension direction of the first power line; a second distance between the first power line and the connecting portion is greater than or equal to a second distance threshold; a third distance between the first power line and the connecting portion is greater than or equal to a third distance threshold; and a fourth distance between the first power line and the connecting portion is greater than or equal to a fourth distance threshold;

wherein the second distance is a maximum distance between a segment, covered by a first barrier dam of the barrier structure, of the first power line and the connecting portion in a direction perpendicular to the extension direction of the first power line; the third distance is a maximum distance between a segment, disposed between the first barrier dam and the second barrier dam of the barrier structure, of the first power line and the connecting portion in the direction perpendicular to the extension direction of the first power line; the fourth distance is a maximum distance between a segment, covered by the second barrier dam, of the first power line and the connecting portion in the direction perpendicular to the extension direction of the first power line; the second distance threshold is greater than the third distance threshold; and the third distance threshold is greater than the fourth distance threshold.

19. The display substrate according to claim 16, wherein the first organic film layer covers the first portion of the second power line, a boundary, proximal to the display region, of the second portion of the second power line, and a boundary, distal from the display region, of the second portion.

20. A display device, comprising: a power drive circuit and a display substrate;
   wherein the display substrate comprises:
   a base substrate, provided with a display region;
   a plurality of pixel units, disposed in the display region;
   a barrier structure, surrounding the display region;
   a first organic film layer, disposed on one side of the base substrate, wherein a gap is defined between an orthographic projection of the first organic film layer on the base substrate and an orthographic projection of the barrier structure on the base substrate; and
   at least one first power line, disposed on a side, proximal to the base substrate, of the first organic film layer, wherein one end of the first power line is disposed on a side, distal from the display region, of the barrier structure and configured to receive a first power signal, and the other end of the first power line is disposed on a side, proximal to the display region of the barrier structure and connected to the plurality of pixel units;
   wherein a length of a side edge of a segment, covered by the barrier structure, of the first power line is greater than a length of a side edge of a segment, covered by a virtual barrier structure with an equal width, of the first power line, and an extension direction of the virtual barrier structure is parallel to an extension direction of the barrier structure
   and the power drive circuit is connected to the at least one first power line in the display substrate and configured to supply the first power signal to the first power line.

* * * * *